US010170450B2

(12) United States Patent
Beyne et al.

(10) Patent No.: US 10,170,450 B2
(45) Date of Patent: Jan. 1, 2019

(54) METHOD FOR BONDING AND INTERCONNECTING INTEGRATED CIRCUIT DEVICES

(71) Applicant: IMEC VZW, Leuven (BE)

(72) Inventors: Eric Beyne, Heverlee (BE); Joeri De Vos, Neerwinden (BE); Stefaan Van Huylenbroeck, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/697,285

(22) Filed: Sep. 6, 2017

(65) Prior Publication Data

US 2018/0068984 A1    Mar. 8, 2018

(30) Foreign Application Priority Data

Sep. 7, 2016  (EP) .................................... 16187668

(51) Int. Cl.
*H01L 25/065*   (2006.01)
*H01L 21/768*   (2006.01)
(Continued)

(52) U.S. Cl.
CPC .... *H01L 25/0657* (2013.01); *H01L 21/76831* (2013.01); *H01L 21/76877* (2013.01);
(Continued)

(58) Field of Classification Search
CPC ................. H01L 25/043; H01L 23/481; H01L 21/76898; H01L 23/64; H01L 51/0017;
(Continued)

(56) References Cited

U.S. PATENT DOCUMENTS

2007/0037379 A1* 2/2007 Enquist ............. H01L 21/76898
438/618
2010/0078770 A1* 4/2010 Purushothaman .. H01L 21/6835
257/621

(Continued)

FOREIGN PATENT DOCUMENTS

DE    10 2012 108 522 A1    3/2014
EP        3 035 369 A1    6/2016

OTHER PUBLICATIONS

Extended European Search Report dated Feb. 16, 2017 issued in EP Application No. 16187668.5.

*Primary Examiner* — John P. Dulka
(74) *Attorney, Agent, or Firm* — Knobbe Martens Olson & Bear LLP

(57) ABSTRACT

A method for bonding and interconnecting two or more IC devices arranged on substrates such as silicon wafers is disclosed. In one aspect, the wafers are bonded by a direct bonding technique to form a wafer assembly, and the multiple IC devices are provided with metal contact structures. At least the upper substrate is provided prior to bonding with a cavity in its bonding surface. A TSV (Through Semiconductor Via) is produced through the bonded wafer assembly and an aggregate opening is formed including the TSV opening and the cavity. After the formation of an isolation liner on at least part of the sidewalls of the aggregate opening (that is, at least on the part where the liner isolates the aggregate opening from semiconductor material), a TSV interconnection plug is produced in the aggregate opening.

11 Claims, 15 Drawing Sheets

(51) Int. Cl.
   *H01L 23/00* (2006.01)
   *H01L 25/00* (2006.01)
   *H01L 23/48* (2006.01)
   *H01L 21/3065* (2006.01)

(52) U.S. Cl.
   CPC ...... *H01L 21/76898* (2013.01); *H01L 23/481* (2013.01); *H01L 24/08* (2013.01); *H01L 24/89* (2013.01); *H01L 25/50* (2013.01); H01L 21/3065 (2013.01); H01L 2224/08146 (2013.01); H01L 2224/80125 (2013.01); H01L 2224/80895 (2013.01); H01L 2224/80896 (2013.01); H01L 2225/06541 (2013.01); H01L 2225/06565 (2013.01); H01L 2225/06593 (2013.01); H01L 2924/14 (2013.01)

(58) Field of Classification Search
   CPC . H01L 23/3142; H01L 23/053; H01L 24/743; H01L 23/12
   See application file for complete search history.

(56) References Cited

U.S. PATENT DOCUMENTS

| | | | |
|---|---|---|---|
| 2010/0289144 A1 | 11/2010 | Farooq et al. | |
| 2011/0111560 A1 | 5/2011 | Purushothaman et al. | |
| 2011/0133339 A1 | 6/2011 | Wang | |
| 2014/0048910 A1* | 2/2014 | Liu | B81C 1/00365 257/621 |
| 2014/0264862 A1 | 9/2014 | Tsai et al. | |
| 2015/0187691 A1* | 7/2015 | Vick | H01L 21/76898 257/774 |
| 2015/0235949 A1 | 8/2015 | Yu et al. | |
| 2017/0005000 A1* | 1/2017 | Beyne | H01L 21/0212 |

\* cited by examiner

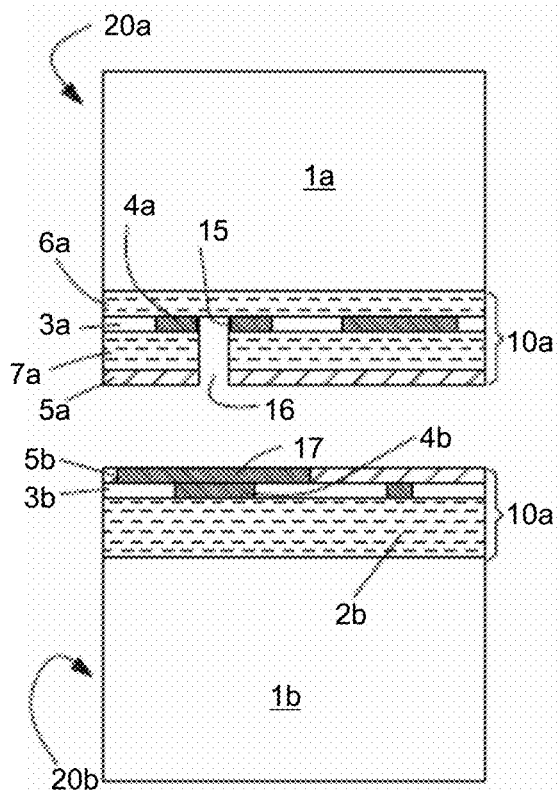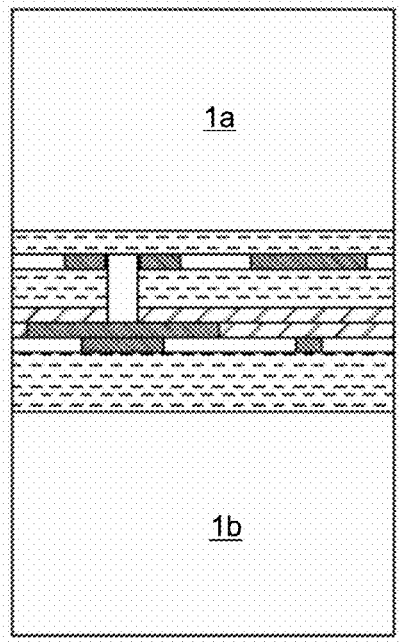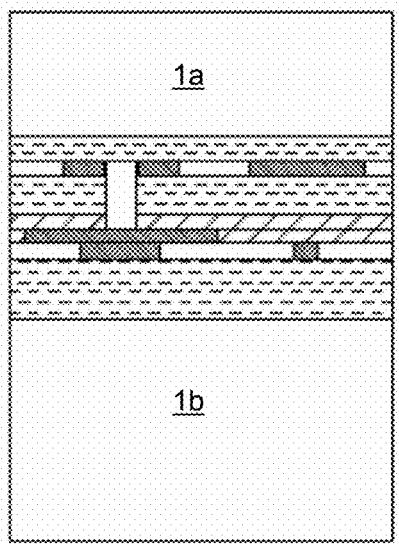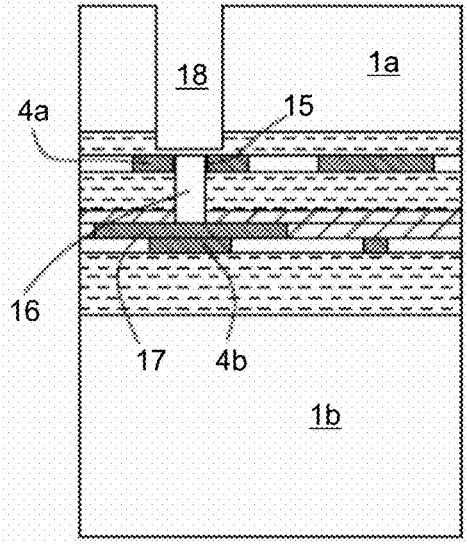
FIG. 1A
FIG. 1B
FIG. 1C
FIG. 1D

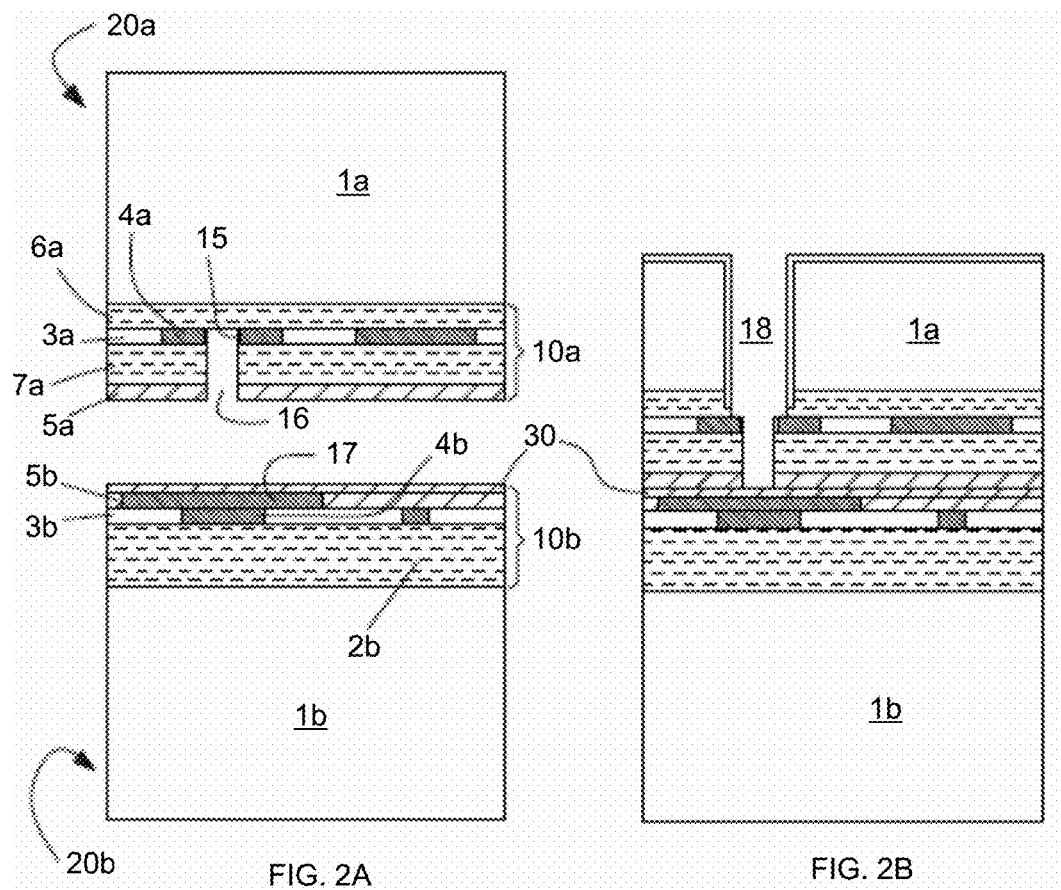
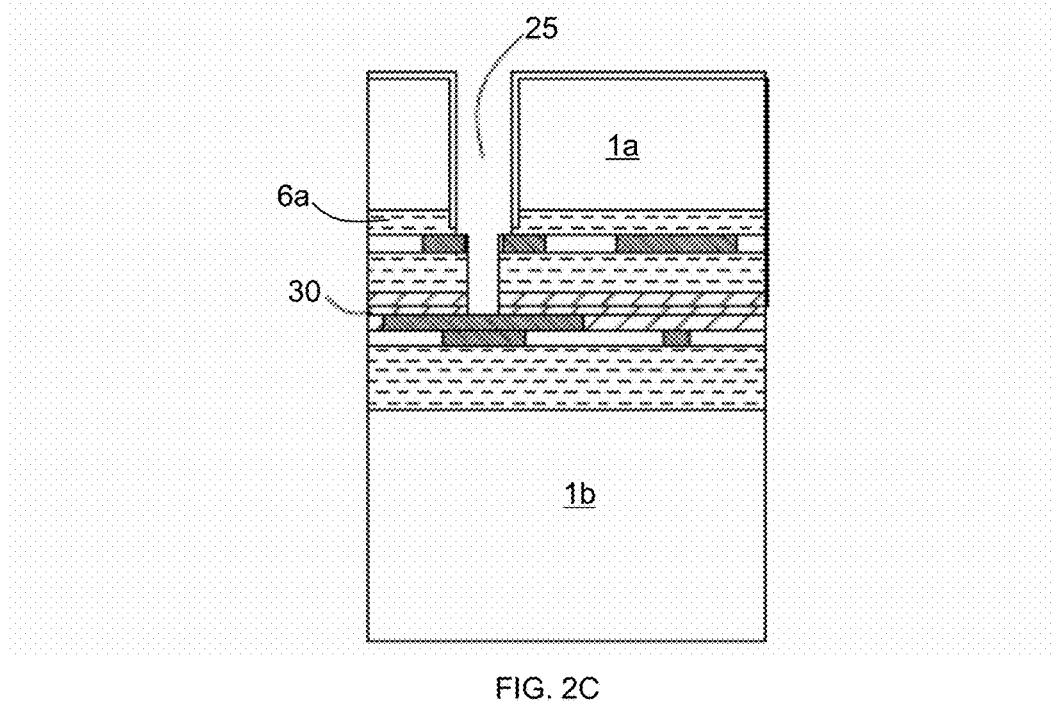
FIG. 2A
FIG. 2B
FIG. 2C

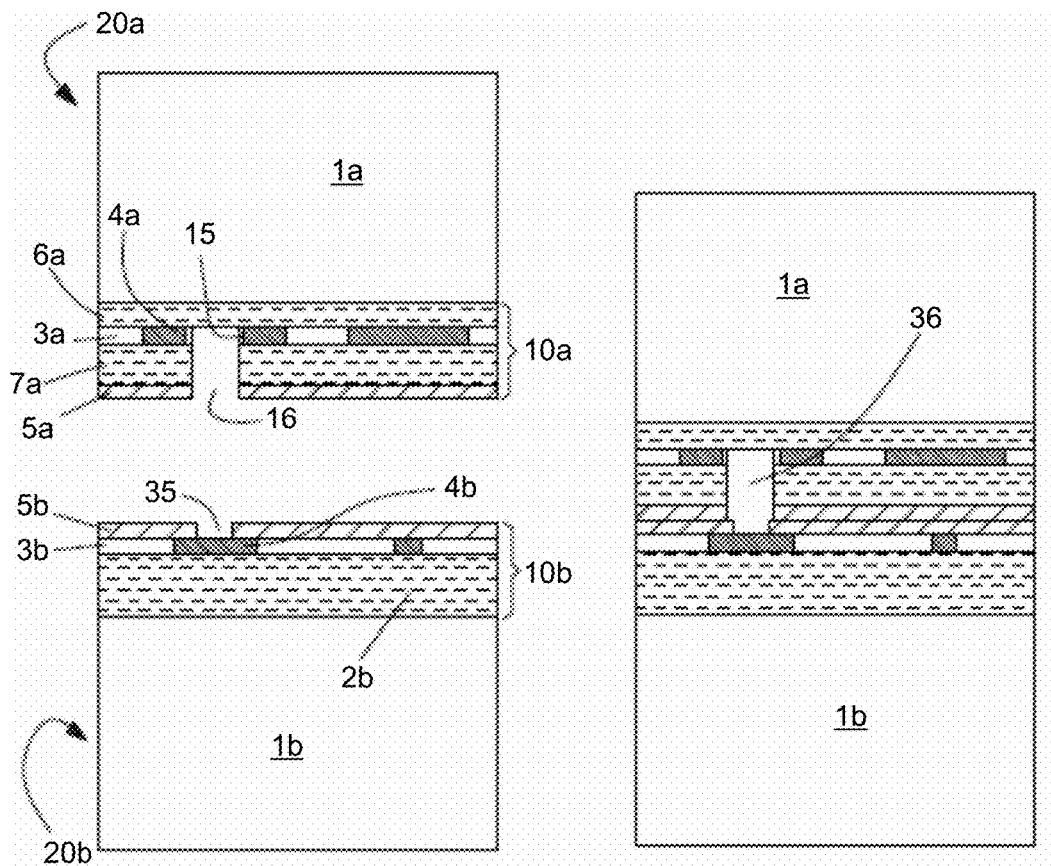
FIG. 4A
FIG. 4B
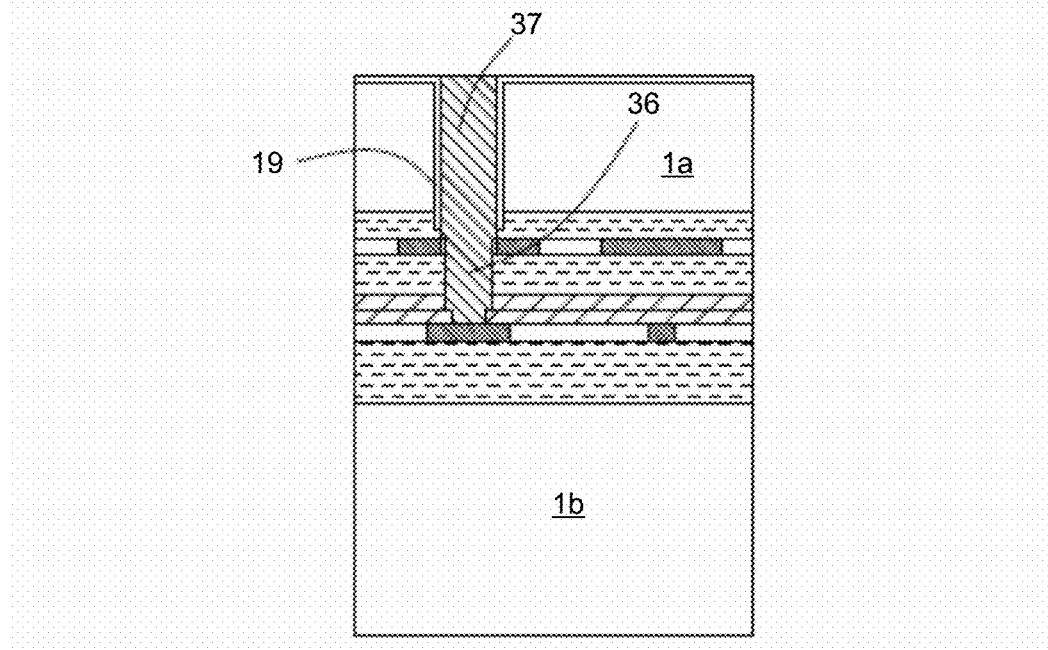
FIG. 4C

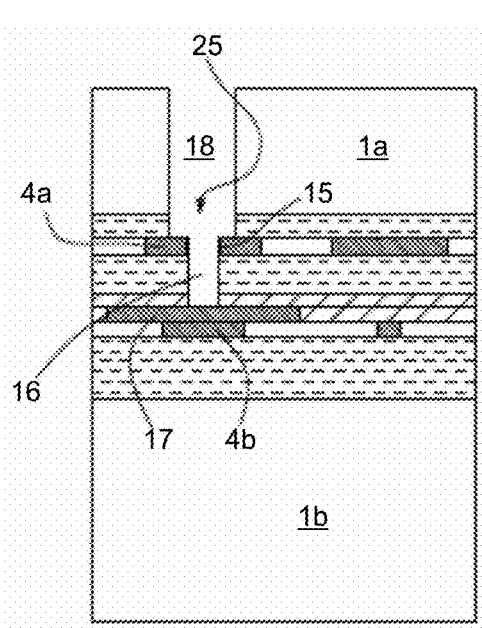
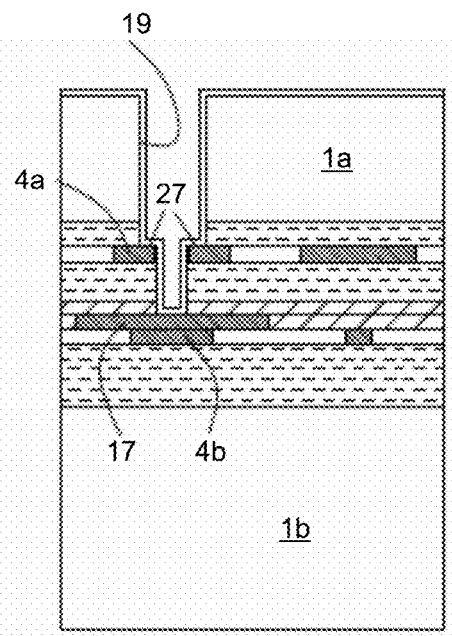
FIG. 5A    FIG. 5B
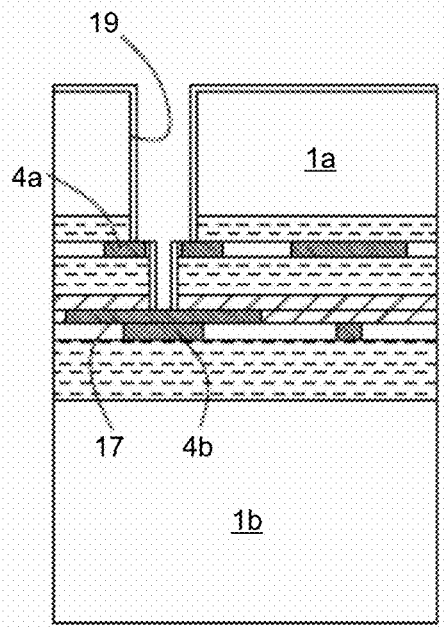
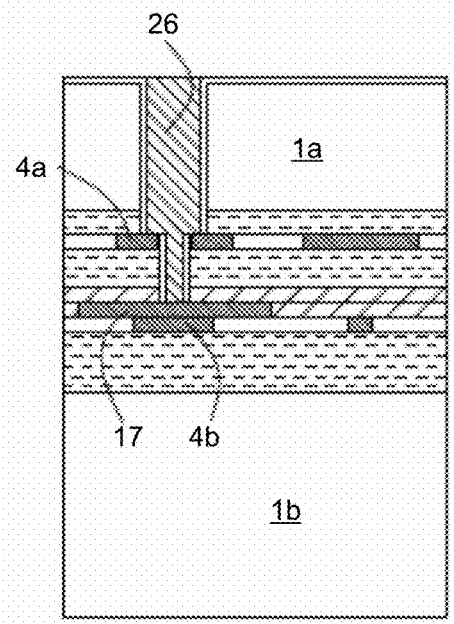
FIG. 5C    FIG. 5D

METHOD FOR BONDING AND INTERCONNECTING INTEGRATED CIRCUIT DEVICES

CROSS-REFERENCE TO RELATED APPLICATION

This application claims foreign priority to European Patent Application No. 16187668.5, filed Sep. 7, 2016, the contents of which are incorporated by reference herein in its entirety.

BACKGROUND

Technological Field

The present disclosure is related to semiconductor processing, in particular to the production of Through Semiconductor Vias for interconnecting stacked IC devices.

Description of the Related Technology 3D-integration of integrated circuit devices, hereafter also referred to as chips or semiconductor chips, produced on semiconductor wafers, has known many developments in recent years. The direct oxide-to-oxide bonding technique is one of the improvements which allows a very effective wafer bonding. It does not, however, result in electrical connections between both wafers or provide for external connections to both wafers. To make such connections, it is known in the present state of the art to produce at least two via-contacts (Through Si vias, TSVs, or more generally referred to as Through Semiconductor Vias or Through Substrate Vias) from the backside of the stack, reaching contacts on the two wafers respectively. Connections are then realized by an additional interconnect, applied after bonding and TSV formation. Disadvantageously, such an additional interconnect increases the capacitance, resistance and inductance of the interconnect structure. Also, because of the tolerance of the wafer-to-wafer bonding technique, the landing pad on the bottom wafer has to be larger than the diameter of the minimum via size by at least two times the overlay tolerance of the wafer-to-wafer bonding plus two times the overlay accuracy of the backside lithography versus the stacked wafer pair fiducials. This results in relatively large via capture pads and limits achievable interconnect pitch.

U.S. Publication No. 2014/0264862 proposes the fabrication of a single TSV plug for contacting two stacked wafers. This is done by bonding two wafers, each comprising a substrate and an IMD (intermetal dielectric) portion comprising metal structures (bond pads, circuitry etc.), so that one intermetal dielectric is bonded to the other. The method includes thinning the top wafer, producing a first opening through the top wafer, producing a second opening through the IMD of the top wafer and partially through the IMD of the bottom wafer, while using metal structures in the top wafer as a hardmask, so that the single plug forms a connection between the circuitry of the top wafer's IMD and the bottom wafer's IMD. A problem occurring when TSVs are etched after direct oxide-to-oxide bonding is that metal contact pads of the upper wafer are exposed to an aggressive etching environment during the time needed to etch through the dielectric bonding layers. Because of this, the upper contact pads may become damaged due to overetching or the sidewall of the TSV opening may become damaged due to sputtering.

SUMMARY OF CERTAIN INVENTIVE ASPECTS

The present disclosure describes a method for bonding and interconnecting two or more IC devices arranged on substrates such as silicon wafers, wherein the wafers are bonded by a direct bonding technique to form a wafer assembly, and wherein the multiple IC devices are provided with metal contact structures. At least the upper substrate is provided prior to bonding with a cavity in its bonding surface. A TSV opening (in the present disclosure "TSV" is the abbreviation for "Through Substrate Via") is produced through the bonded wafer assembly and an aggregate opening is formed comprising the TSV opening and the cavity. After the formation of an isolation liner on at least part of the sidewalls of the aggregate opening (i.e., at least on the part where the liner isolates the aggregate opening from semiconductor material), a TSV interconnection plug is produced in the aggregate opening.

The interconnection plug is either in direct contact with a contact structure of the first IC device, or the interconnection plug forms a part of the an interconnection path between the contact structure of the second IC device ($10b$) and a contact structure of the first IC device ($10a$).

In the present disclosure, including the appended claims, a "cavity in the surface" of a device or substrate is synonymous with an opening in the device or substrate, obtainable by etching through the surface down to a given depth. In other words, the cavity is open towards the environment that is in contact with the surface. A cavity is said to "traverse" a layer when the depth of the cavity reaches down to at least the lower level of the layer.

The term "overlap" or "overlapping" when applied to a cavity, a TSV opening, or a metal contact structure has the following meaning in the present disclosure: one element (for example, a TSV opening) overlaps another element (for example, a cavity) if:

the cross-section of the TSV opening fully covers the cross-section of the cavity, the cross section of the TSV opening being larger than the cross section of the cavity, or
 the cross section of the TSV opening is located within the cross section of the cavity, the cross section of the TSV opening being smaller than the cross section of the cavity, or
 the cross-section of the TSV opening partially covers the cross-section of the cavity, the cross-section of the TSV opening being either larger or smaller than the cross section of the cavity, wherein all cross sections are regarded in a plane parallel to the substrate into which the cavity, the TSV opening, or the metal contact structure are produced or located.

The term "redistribution layer" within the present disclosure is a dielectric layer with metal connections embedded therein, not necessarily connections which distribute current to other locations in the plane of the layer. The meaning of this term for the purpose of this description is therefore somewhat broader than the meaning accepted in the domain of IC-processing.

The present disclosure is thus related to a method for bonding and interconnecting a first IC device arranged on a first substrate to a second IC device arranged on a second substrate, wherein each IC device includes a dielectric bonding layer at its outer surface, and wherein each IC device further includes one or more metal contact structures, wherein the method includes the steps of:

producing at least one cavity in the outer surface of the first IC device, the cavity traversing at least the dielectric bonding layer of the first IC device, and thereafter:

aligning the first substrate with respect to the second substrate, and forming a substrate assembly by direct bonding between the bonding layers, so that in the substrate assembly the cavity formed in the first IC device overlaps a contact structure of the second IC device, and thereafter:

after bonding, optionally thinning the first substrate and thereafter:

producing a Through Substrate Via (TSV) opening in the first substrate, the TSV opening overlapping the cavity, forming an aggregate opening including the TSV opening and the cavity, thereby exposing at least part of the contact structure of the second IC device, after the formation of an isolation liner on at least part of the sidewalls of the aggregate opening, producing a metal interconnection plug in the aggregate opening, that contacts the contact structure of the second IC device, and forms at least part of an interconnection path between the contact structure of the second IC device and a contact structure of the first IC device.

According to an embodiment, the first IC device includes a stack of dielectric layers with the bonding layer being present on top of the stack of dielectric layers, wherein the cavity further traverses one or more of the stack of dielectric layers.

In the latter embodiment, the first IC device may include a front-end-of-line (FEOL) portion and a back-end-of-line (BEOL) portion wherein the stack of dielectric layers is a stack of intermetal dielectric layers in the BEOL portion or in the BEOL portion as well as in the FEOL portion of the first IC device.

According to an embodiment, the cavity is in close proximity to a metal contact structure of the first IC device, and the TSV opening overlaps the contact structure of the first IC device, so that the interconnection plug interconnects the contact structure of the first IC device with the contact structure of the second IC device.

In the latter embodiment, the metal contact structure in the first IC device may be a metal contact pad that is part of the FEOL portion or the BEOL portion of the first IC device.

Further in the latter embodiment, the contact structure of the first IC device may be a metal pad with a centrally placed open area, wherein the cavity of the first IC device at least partially traverses the open area (i.e., traverses the layer of material within the open area). Alternatively, the contact structure of the first IC device may be a metal pad with a polygon-shaped cross-section in the plane of the contact pad, wherein the bottom of the cavity is in close proximity to the polygon-shaped metal pad.

According to an embodiment:

the second IC device includes a metal contact pad incorporated in the bonding layer of the second IC device so that the upper surface of the metal contact pad is essentially in the same plane as the upper surface of the bonding layer, the metal contact pad is in electrical contact with a metal contact structure of the second IC device, and in the substrate assembly, the cavity overlaps the metal contact pad.

In the latter embodiment, an additional dielectric bonding layer may be present on the bonding layer into which the metal contact pad is incorporated, wherein the formation of the aggregate opening includes a step of etching through the additional dielectric bonding layer in the area of the additional layer overlapping the cavity.

According to an embodiment, the second IC device is equally provided with a cavity in the outer surface of the device, the cavity traversing at least the bonding layer of the second IC device, wherein the cavity of the second IC device overlaps the metal contact structure of the second IC device, and wherein bonding is performed so that both cavities are overlapping in the substrate assembly so as to form an aggregate cavity after bonding.

According to an embodiment:

the procedure applied for producing the TSV opening is stopped before reaching the cavity, leaving a layer of remaining dielectric material between the TSV opening and the cavity, and thereafter:

the isolation liner is deposited on the sidewalls and the bottom of the TSV opening, followed by the step of removing the isolation liner from the bottom of the TSV opening, and thereafter:

the layer of remaining material between the TSV opening and the cavity is equally removed when forming the aggregate opening.

According to another embodiment:

the procedure applied for producing the TSV opening is continued until the cavity is reached, thereby forming the aggregate opening, and thereafter:

the isolation liner is deposited on the sidewalls, the bottom, and the horizontal portions of the aggregate opening, and thereafter:

the isolation liner is removed from the bottom and from the horizontal portions of the aggregate opening before producing the interconnection plug.

According to still another embodiment:

after the formation of the TSV opening, an additional substrate or a stack of additional substrates is bonded to the substrate assembly, each additional substrate carrying an additional IC device, the additional substrate or the stack of additional substrates is provided with a second cavity in its bonding surface, before bonding the additional substrate or stack of substrates to the assembly, so that the bonding step results in a new assembly wherein the second opening overlaps the TSV opening to form a second cavity, thereafter a second TSV opening is produced in the new assembly, the additional TSV opening overlapping the second cavity, thereby forming a new aggregate opening including the cavity in the first IC device, the TSV opening, the second cavity, and the second TSV opening, optionally the previous steps are repeated one or more times, each time adding a further substrate or stack of substrates to the assembly, and leading to a final assembly including a final aggregate opening, after the formation of an isolation liner on at least part of the sidewalls of the final aggregate opening, a metal interconnection plug is produced in the final aggregate opening, that contacts the contact structure of the second IC device.

In the latter embodiment, a stack of two additional substrates may be bonded to the substrate assembly, wherein the stack is obtained by bonding the first additional substrate to the second additional substrate in accordance with the previously described embodiment wherein an aggregate cavity is formed, to obtain a stack including the aggregate cavity, and wherein an additional TSV opening is produced in the bonding surface of the stack, to thereby obtain a stack with the second cavity in its outer surface, the second cavity formed by the aggregate cavity and the additional TSV opening.

Also in the latter embodiment, each of the IC devices in the final assembly may include a contact structure that is contacted by the interconnection plug formed in the final aggregate opening.

BRIEF DESCRIPTION OF THE DRAWINGS

FIGS. 1A through 1H illustrate the steps of the method for bonding and interconnecting two semiconductor wafers according to an embodiment of the present disclosure.

FIGS. 2A through 2C illustrate the method according to a second embodiment of the present disclosure.

FIGS. 4A through 4C illustrate the method according to a fourth embodiment of the present disclosure.

FIGS. 5A through 5D illustrate an alternative form of the embodiment of FIG. 1.

DETAILED DESCRIPTION OF CERTAIN ILLUSTRATIVE EMBODIMENTS

Figure 1E:
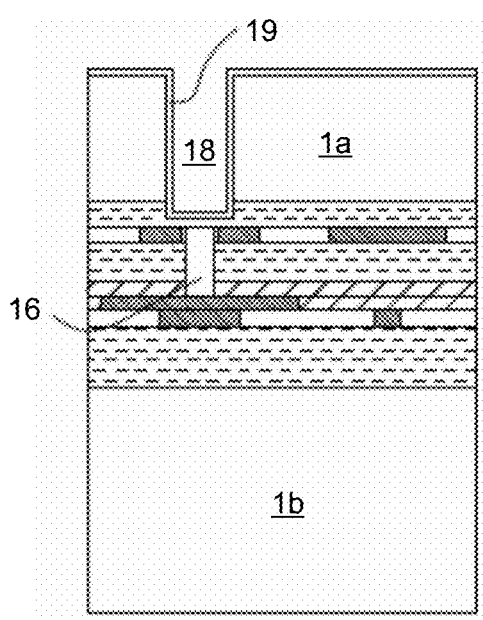

FIG. 1A shows the starting point of the method according to an embodiment for bonding and interconnecting two IC devices, hereafter referred to as chips. Two wafers 20a/20b are provided which are to be bonded in a wafer-to-wafer bonding technique. Each of the wafers comprises a semiconductor support substrate 1a/1b, e.g., a silicon substrate carrying at least one chip 10a/10b. These chips 10a/10b are to be bonded to form a 3D integrated device stack. The first chip 10a is to be bonded onto the second chip 10b. Both chips 10a/10b comprise a Front-End-Of-Line (FEOL) portion produced on the semiconductor substrate and a Back-End-Of-Line (BEOL) portion on the FEOL portion. The terms FEOL and BEOL are known in the art of semiconductor processing. FEOL refers to the part including active components such as transistors, and BEOL refers to the part including a metallization stack, i.e., a stack of dielectric layers (known as IMD or "intermetal dielectric layers") with metal lines and via connections embedded therein, connecting the components of the FEOL portion to contact structures external to the chip. In the second chip 10b, the FEOL and BEOL portions are schematically indicated, without a visible distinction being made between FEOL and BEOL, by reference numeral 2b.

The second chip 10b further includes a redistribution layer 3b which is a further dielectric layer on top of the BEOL portion with metal contact structures embedded therein, with the latter contact structures being configured for connecting the chip to other contacts external to the chip. The redistribution layer 3b is shown as a separate layer for the sake of clarity but this layer may be part of the BEOL portion or may be a layer similar to a layer of the BEOL portion and produced in the same process sequence. The dielectric used in layer 3b may be a dielectric suitable for producing intermetal dielectric layers.

The first chip 10a equally has a FEOL portion and a BEOL portion, drawn in this case as two layers 6a and 7a respectively, with a redistribution layer 3a in between the two. The redistribution layer is again drawn as a separate layer, but this may also be a layer that is similar to or a part of the BEOL portion 6a or of the FEOL portion 7a and that may be produced in one process sequence with one of these portions. So instead of being strictly FEOL, the portion 6a can be a layer comprising the FEOL portion of the chip and part of the BEOL portion. The contact structures 4a/4b may be contact pads that are part of the BEOL or FEOL portions. The dielectric of layer 3a is again preferably a material suitable for use as an intermetal dielectric.

The metal contact structures in the embodiment shown in FIG. 1A comprise metal contact pads 4a and 4b in the upper chip 10a and the lower chip 10b respectively, which are to be electrically connected by the method of the present disclosure. Both pads may for example have a circular or polygon shaped surface. The upper pad 4a has an opening 15, preferably in the center, for example a circular opening.

The wafers 20a/20b are furthermore provided with dielectric bonding layers 5a/5b suitable for direct bonding. The dielectric material of the bonding layers may be silicon oxide, silicon carbon nitride (SiCN) or the bonding layers may comprise a stack of different materials. Direct bonding is a bonding technique known per se, wherein the bond is established by providing dielectric bonding layers on the two wafers, bringing these bonding layers into mutual contact and preferably applying an annealing step.

In accordance with the present disclosure, the first chip 10a is provided with a cavity 16 in its outer surface, preferably having a circular cross-section. The cavity 16 traverses the dielectric bonding layer 5a, the BEOL portion 7a and the dielectric 3a within the opening 15. Cavity 16 may be produced by a suitable lithography and etch technique, for example a plasma etch applying the precursor $C_4F_8$ in an oxygen and argon atmosphere. It is to be understood that the BEOL layers traversed by the cavity do not include semiconductor or metal materials at the location of the cavity, i.e., the cavity traverses only dielectric materials.

The second chip 10b is provided with a metal contact pad 17 incorporated in the dielectric bonding layer 5b. The metal pad 17 is obtainable after producing the bonding layer 5b, by a single damascene process as known in the art. The metal pad 17 is in electrical contact with the contact pad 4b of the second chip 10b. The lateral dimensions of the metal pad 17 take into account the tolerance of the wafer-to-wafer alignment process so that when the wafers are aligned and bonded, the cavity 16 overlaps the metal pad 17. Preferably the totality of the cavity 16 is located within the boundaries of the metal pad 17, more preferably the two are essentially concentric as shown in the drawing. The upper surface of the second chip 1b is polished by a chemical mechanical polishing step, so that the upper surface of the metal pad 17 is polished to a degree suitable for performing hybrid bonding, as known in the art. Hybrid bonding is a form of direct bonding wherein the dielectric bonding layers include metal areas with their outer surface essentially in the same plane as the outer surface of the bonding layer. Possibly, after polishing, the metal pad 17 may be slightly recessed with respect to the bonding layer 5b, e.g., by a distance of 5 to 10 nm.

As illustrated in FIG. 1B, the wafers are positioned by aligning the metal contact pads 4a and 17/4b and the bonding layers 5a/5b are brought into mutual contact. An annealing step is preferably performed in order to establish a strong bond. When the bond is formed, the result is an assembly of the two wafers (referred to as the "substrate assembly" in the appended claims) as shown in FIG. 1B. This assembly is then subjected to a polishing step, to remove a portion of the top wafer's semiconductor substrate 1a, typically reducing this substrate to a thickness of less than 50 micrometer. The result of this thinning step is illustrated in FIG. 1C.

By a lithography and anisotropic etch step (FIG. 1D), preferably a plasma etch step, a TSV opening 18 is etched through the back of the thinned upper semiconductor substrate 1a, and through the FEOL portion 6a of the upper chip 10a. In the embodiment shown, the etching is stopped before reaching the metal contact pad 4a and thereby the cavity 16. Alternatively, the etching may be continued until reaching the cavity 16, as will be explained later in this description. Stopping short of the cavity is the preferred option, because it prevents sputtering of copper from the metal contact pad 4a at the end of the TSV etch.

In the embodiment of FIGS. 1A through 1H, the TSV opening 18 is preferably a cylindrical opening with a given diameter. The litho/etch step involves producing a resist mask on the upper substrate 1a, etching the area not covered by the resist mask, followed by stripping of the resist. The TSV opening 18 is produced above the upper contact pad 4a that is provided with the opening 15 and with the cavity 16 through the opening. In any embodiment of the present disclosure, the cross section of the TSV opening 18 (in a plane parallel to the bonded wafers) overlaps the cross section (in the same plane) of the cavity 16. Preferably the cross-section of the TSV opening 18 is larger than the cross section of the cavity 16. In the specific embodiment of FIGS. 1A through 1H, the outer diameter of the contact pad 4a and of the opening 15 in the center of the contact pad 4a are chosen with respect to the diameter of the TSV opening 18, and taking into account the tolerance on the alignment of the litho-mask for producing the TSV opening 18, so that the cross section of the TSV opening 18 fully covers the circular opening 15 and a portion of the pad 4a itself, whilst staying within the outer boundaries of the contact pad 4a. In the ideal case shown in the figures, i.e., the case where no alignment or overlay errors are occurring, the TSV opening 18 is concentric with the circular opening 15 and with the contact pad 4a itself.

Then a conformal dielectric layer 19 is deposited on the upper surface of the thinned substrate 1a, the sidewalls of the TSV opening 18 and the bottom of the TSV opening 18, as shown in FIG. 1E. This conformal dielectric layer 19 is also known as a liner dielectric, hereafter referred to in short as the "liner." Its function is to isolate semiconductor material in the substrate 1a of the upper chip 10a from the metal contact plug that is to be formed in the TSV opening 18. The material and deposition technique for forming the liner is in accordance with standard techniques known to the skilled person. The liner may consist of or comprise $SiO_2$, SiCO, SiN, SiCN or other suitable materials, deposited for example by Atomic Layer Deposition or Chemical Vapor Deposition (CVD).

Figure 1F:
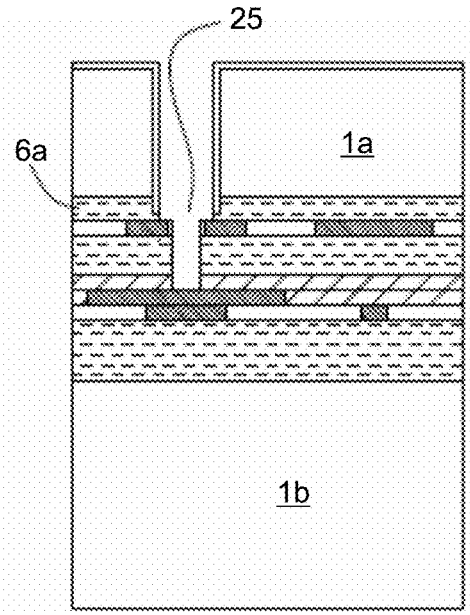

The liner 19 is subsequently removed from the bottom of the TSV opening 18, while on the sidewalls of the TSV opening, the liner remains at a thickness sufficient to perform the isolating function (FIG. 1F). This is preferably achieved without a lithography step, i.e., without forming a photoresist mask or a hardmask that covers the sidewalls and exposes a portion of the bottom of the TSV opening 18. A preferred way of removing the liner 19 from the bottom of the TSV opening 18 while essentially maintaining the liner on the sidewalls is described in document EP Publication No. 3035369A1. This method may be applied in any of the embodiments according to the present disclosure. In this method, a plasma etch is performed in an atmosphere comprising a polymer-forming component, so that a protective polymer is deposited on the bottom and any horizontal portions of the TSV opening during plasma etching.

As seen in FIG. 1F, when the liner 19 has effectively been removed from the bottom of the TSV opening 18, the plasma etch continues through the remaining layer of the FEOL portion 6a between the TSV opening 18 and the cavity 16. This remaining layer of material of the FEOL portion 6a is necessarily in this case a layer that comprises no semiconductor materials, given that the liner 19 will not cover the sidewalls of this area once the layer is removed. The remaining layer is typically an intermetal dielectric (IMD) layer. The plasma etch thus continues until reaching the cavity 16, resulting in an aggregate opening 25, as shown in FIG. 1F.

If the method according to EP Publication No. 3035369A1 has been applied for removing the liner, the protective polymer layer (not shown) is then removed. This may be achieved by a treatment in an oxygen based plasma. The step of removing the protective polymer layer may advantageously be performed within the same plasma treatment tool where the previous plasma treatment was performed. Alternatively, the protective polymer layer may be removed using any suitable technique, such as wet etching or use of a dedicated remover.

Figure 1G:
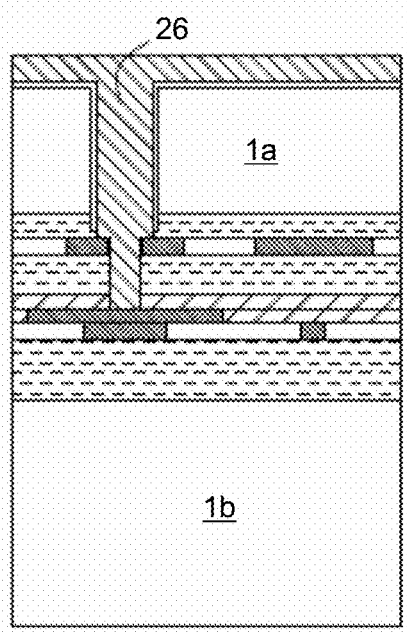
Figure 1H:
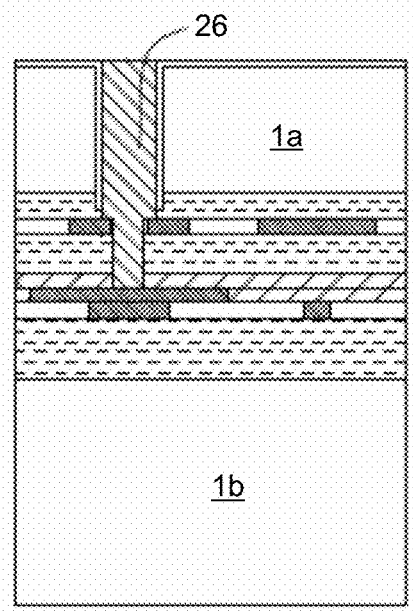

Then a seed layer, and if required a barrier layer or an adhesive layer, are deposited (not shown) on the interior surface of the aggregate opening 25, and the aggregate opening is filled with a metal, preferably by an electroplating step, preferably using copper as the deposited metal (FIG. 1G). The result is the formation of a metal plug 26, hereafter also referred to as TSV plug or TSV, or an "interconnection" plug, given its function as an electrical interconnection between the IC chips 10a and 10b. An alternative method is electroless deposition of metal, e.g., Cu or Ni or deposition of W by Chemical Vapor Deposition. After producing the TSV in this manner, the metal in the TSV opening may be recessed by a chemical mechanical polishing (CMP) step (FIG. 1H). By the above-described method, an electrical interconnection is established between the upper chip 10a and the lower chip 10b by a single TSV 26.

The prior formation of the cavity 16 in the upper wafer 20a ensures that etching of the TSV opening 18 causes minimal or no damage to the contact pad 4a of the upper chip 10a, or sputtering of copper from this upper contact pad. This is a significant advantage of any embodiment according to the present disclosure.

According to a second embodiment, illustrated in FIG. 2A through 2C, an additional dielectric bonding layer 30 is applied on the lower wafer 20b, prior to the bonding step. This ensures that the bonding step is established by a 100% dielectric-to-dielectric bond, which is a higher quality bond then the hybrid bond obtained in the first embodiment. The presence of the extra bonding layer 30 does result in the requirement of an extra etching step for removing this bonding layer from the bottom of the aggregate opening 25, as illustrated in FIG. 2C. This extra etching step may be the continuation of the etching process through the remaining part of the FEOL portion 6a between the TSV opening 18 and the cavity 16. Apart from this difference, the method according to the second embodiment includes the same Method steps and details as described above with respect to the first embodiment. It is preferred, however, that the metal contact pad 4a of the upper chip 10a is not a copper contact pad or that it is a copper contact pad provided with a non-copper layer on the surface. This is to avoid or minimize copper sputtering during the removal of the additional dielectric bonding layer 30 at the bottom of the aggregate opening 25. It is advantageous in that regard to use a contact layer of the FEOL portion comprising Tungsten contact pads as the redistribution layer 3a. The use of tungsten in the FEOL portion is known in the art. Alternatively, copper contacts pads are generally provided with a stack of a TaN and Ta layer. When properly dimensioned, these layers can have the function of protecting the copper during etching of the additional dielectric bonding layer 30.

Figure 3A:
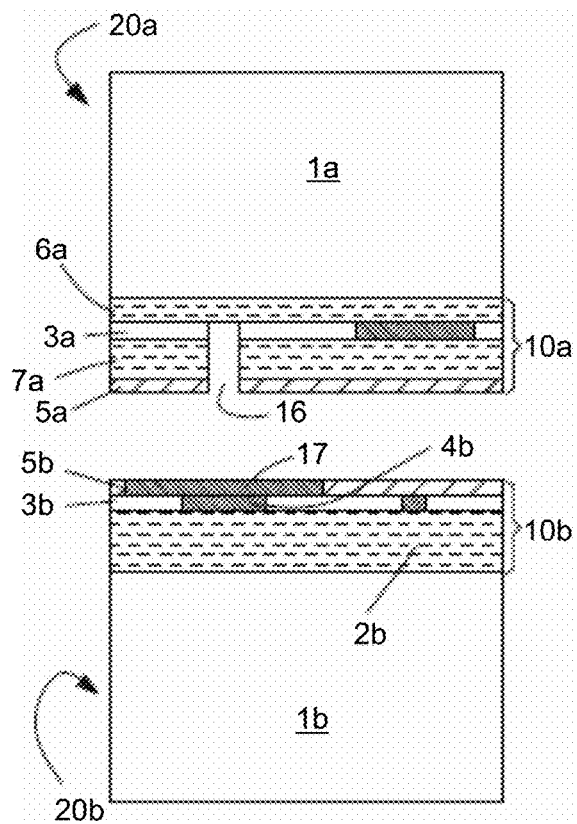
FIGS. 3A through 3C illustrate the method according to a third embodiment of the present disclosure.
Figure 3B:
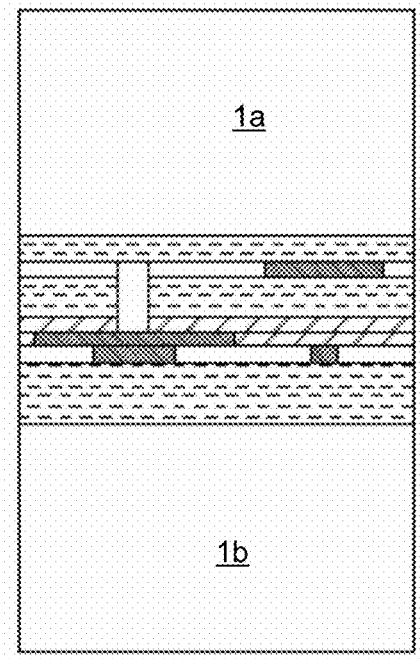
Figure 3C:
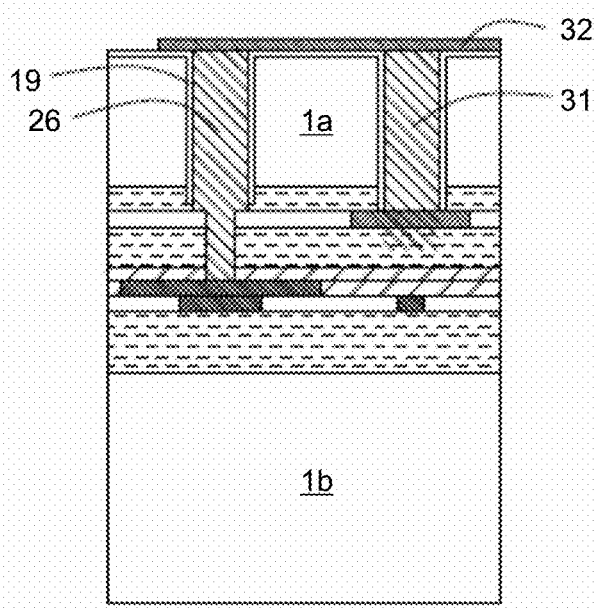

According to a third embodiment, illustrated in FIGS. 3A and 3B, the cavity 16 is not made through or adjacent to a metal contact pad in the upper chip. Instead, the cavity can be made anywhere on the surface of the upper chip 10a, while traversing the dielectric bonding layer 5a, the BEOL portion 7a, and the dielectric of the redistribution layer 3a, as shown in FIG. 3A. In this way, a TSV can be produced that contacts the lower chip 10b only. The first chip 10a is aligned and bonded so that the cavity 16 overlaps the contact pad 17 of the lower chip 10b, taking into account the alignment tolerance, as shown in FIG. 3B. Etching the TSV opening 18 to create an aggregate opening with a liner 19 on the sidewalls is done in the same way as described above. Also by the same method steps as described above, a metal-filled TSV 26 is produced in the aggregate opening, contacting the metal contact pad 17 in the lower chip, as shown in FIG. 3C. The connection between the lower chip and the upper chip is then done by a second TSV 31 and a connection 32 as presently known in the art. The TSV 26 is still referred to as an "interconnection" plug, as it forms part of the electrical path between the IC chips 10a and 10b.

According to yet another embodiment, cavities can be produced in both wafers prior to the bonding step. This embodiment is illustrated in FIGS. 4A through 4C. In this embodiment, the lower chip 10b has a cavity 35 in the dielectric bonding layer 5b, overlapping with the contact pad 4b of the lower chip. The cavity 35 is circular in cross section with a diameter that is preferably smaller than the cavity 16. The diameters of the two cavities are chosen so that taking into account the alignment tolerance, the larger cavity 16 fully covers the smaller cavity 35. The two cavities thereby form an aggregate cavity 36 after bonding, as shown in FIG. 4B. After this, the steps described with respect to the first embodiment are performed, leading to a TSV plug 26 as shown in FIG. 4C, which interconnects the two chips 10a and 10b.

The most general description of the characterizing features of the present disclosure is that a cavity is made in the surface of the upper chip prior to bonding, and that this cavity traverses at least the dielectric bonding layer 5a of the upper chip. Preferably the cavity traverses both the dielectric bonding layer and a number of additional dielectric layers underneath the bonding layer. If the cavity is limited to the bonding layer, the etching of the TSV opening will take longer and the risk of overetching and sputtering is still present, but to a lesser degree than in the presently-existing methods.

According to another embodiment, the aggregate opening is formed directly by the TSV etch, i.e., etching of the TSV opening continues until reaching the cavity 16 or 36. This increases the risk of Cu sputtering but this can be mitigated by a well-timed etch and/or by relying on the TaN/Ta layer on the copper pads or by using tungsten contact pads applied in the FEOL portion as already described above. This embodiment is illustrated in FIGS. 5A through 5D. FIG. 5A shows the process stage where the same two chips 10a/10b as the ones shown in the embodiment FIGS. 1A through 1H have been bonded by direct bonding, and wherein, contrary to the process shown in FIGS. 1A through 1H, the TSV opening 18 is now etched through down to the cavity 16 to thereby create the aggregate opening 25. As shown in FIG. 5B, the liner 19 is now deposited on the sidewalls and the bottom of the aggregate opening 25, including on the horizontal parts 27 between the TSV opening 18 and the cavity 16, the horizontal parts including the exposed portions of the metal pad 4a of the upper chip. The plasma etch combined with the polymer-forming component as described above is applied and tuned to remove the liner from the bottom of the cavity 16 and from the horizontal parts 27, resulting in the situation shown in FIG. 5C. This is followed by the creation of the metal plug 26, as shown in FIG. 5D, by the same method steps described in relation to the embodiment of FIGS. 1A through 1H.

Figure 6A:
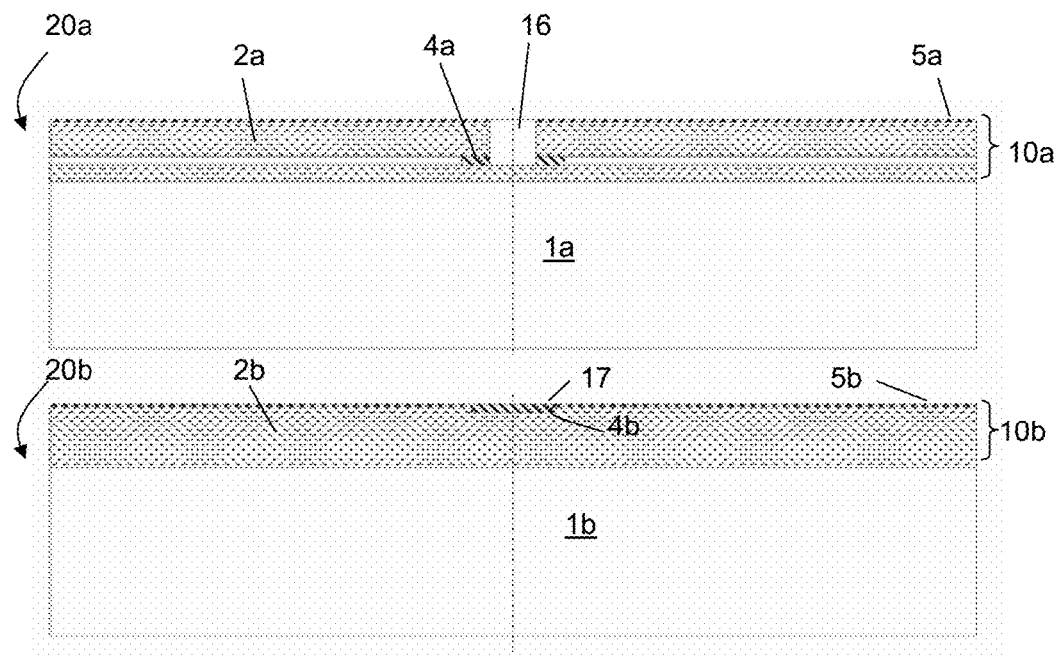
FIGS. 6A through 6K illustrate how the method of the present disclosure can be applied for a stack of multiple wafers.
Figure 6B:
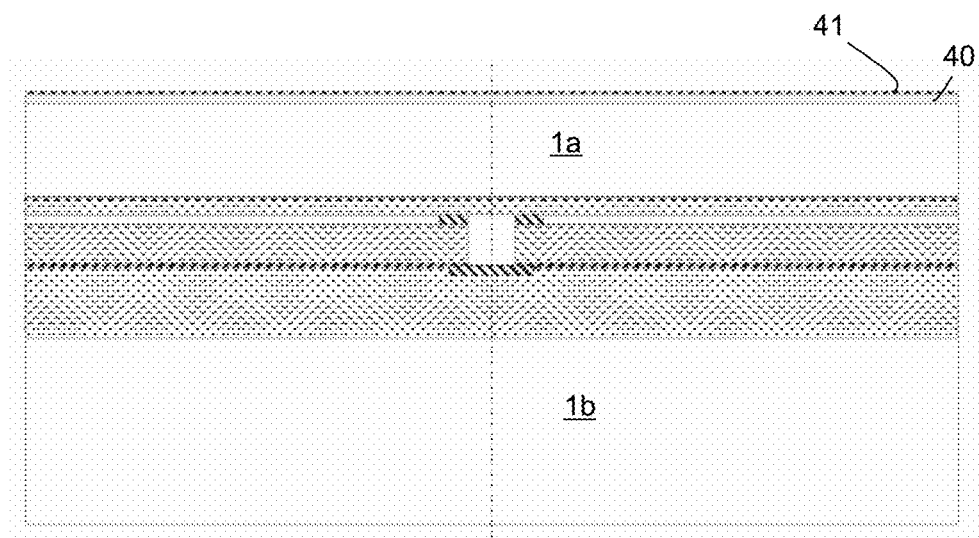
Figure 6C:
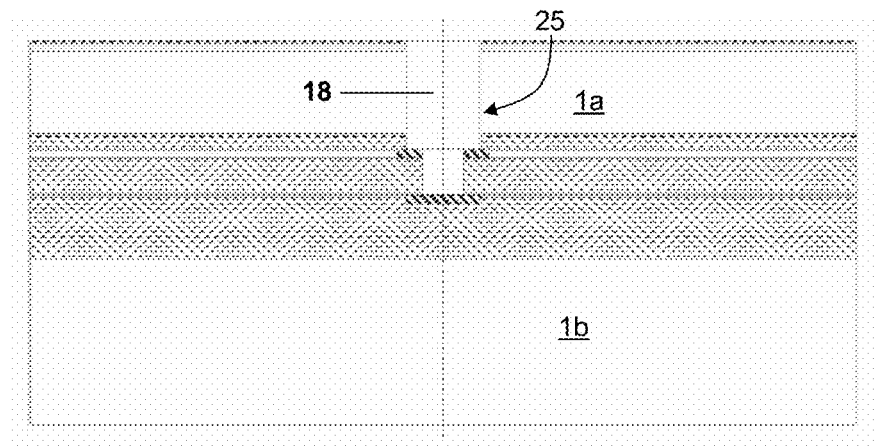
Figure 6D:
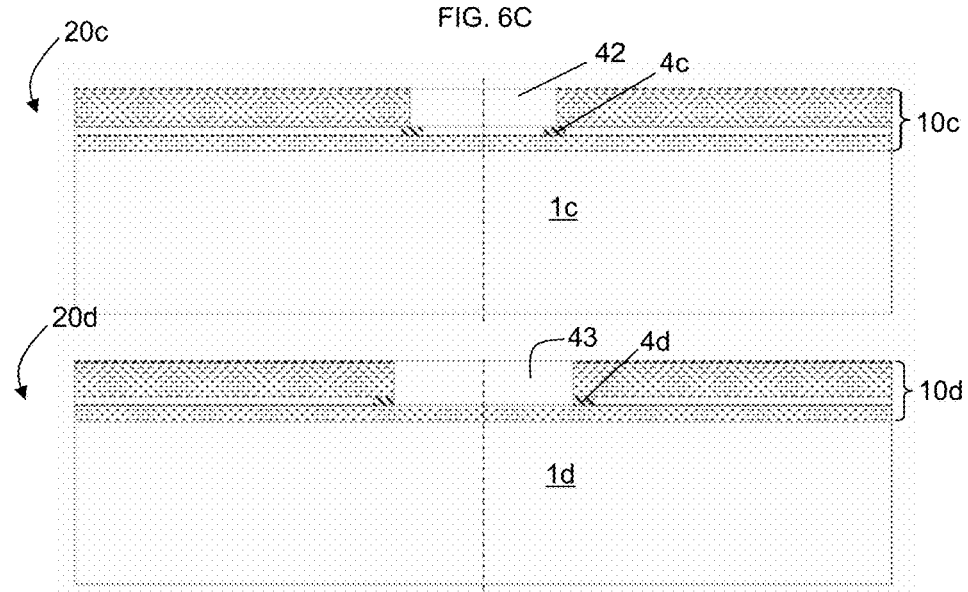
Figure 6E:
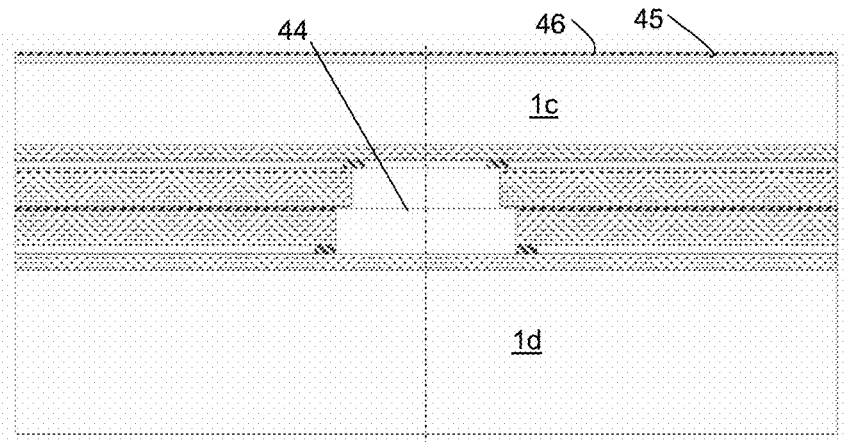
Figure 6F:
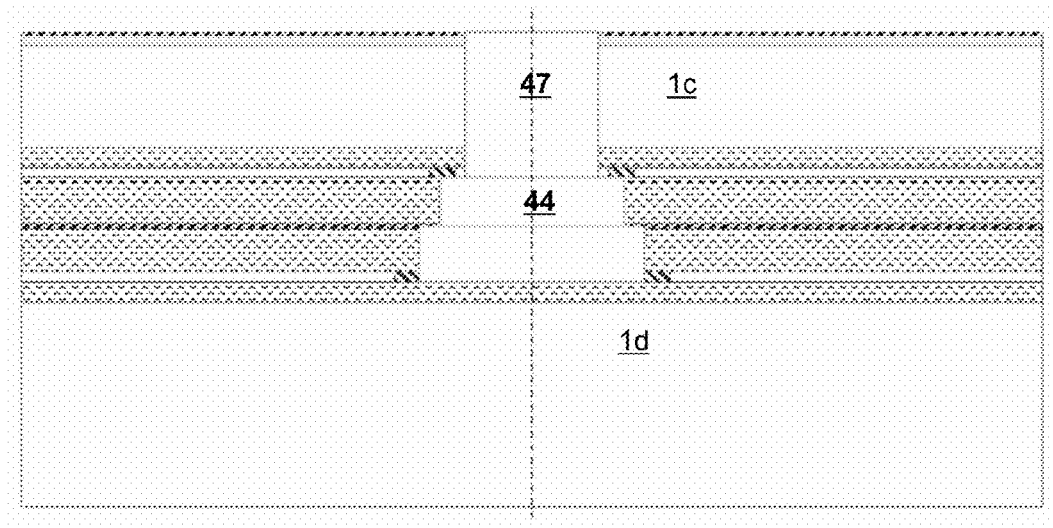
Figure 6G:
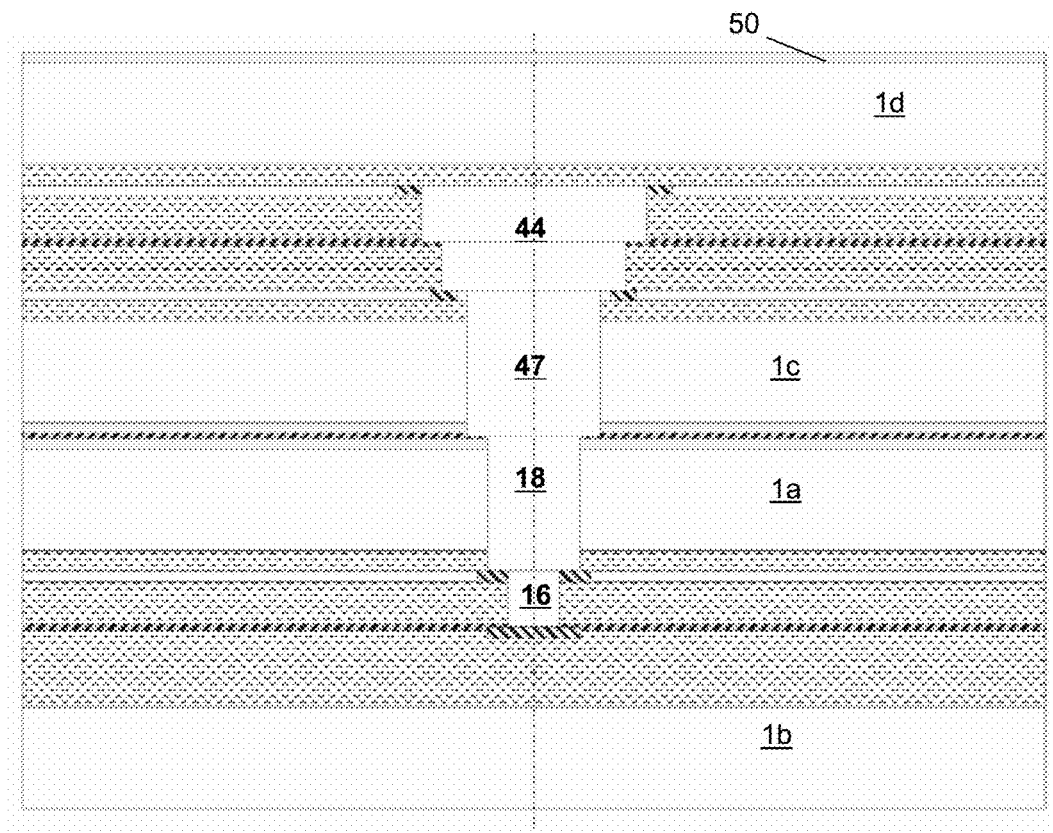
Figure 6H:
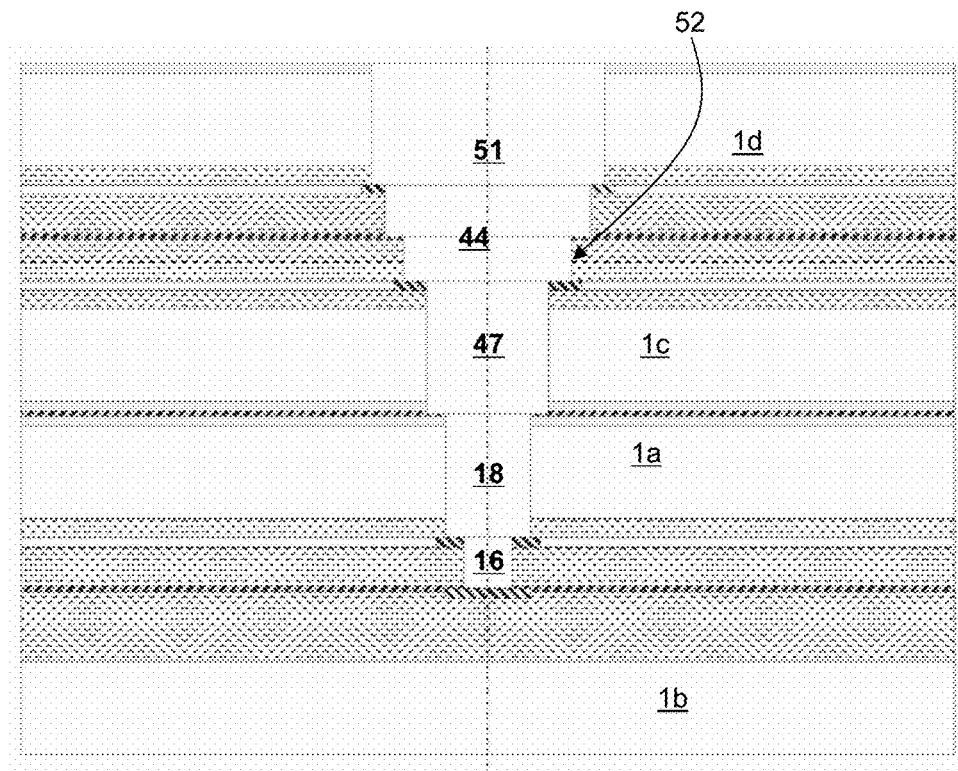
Figure 6I:
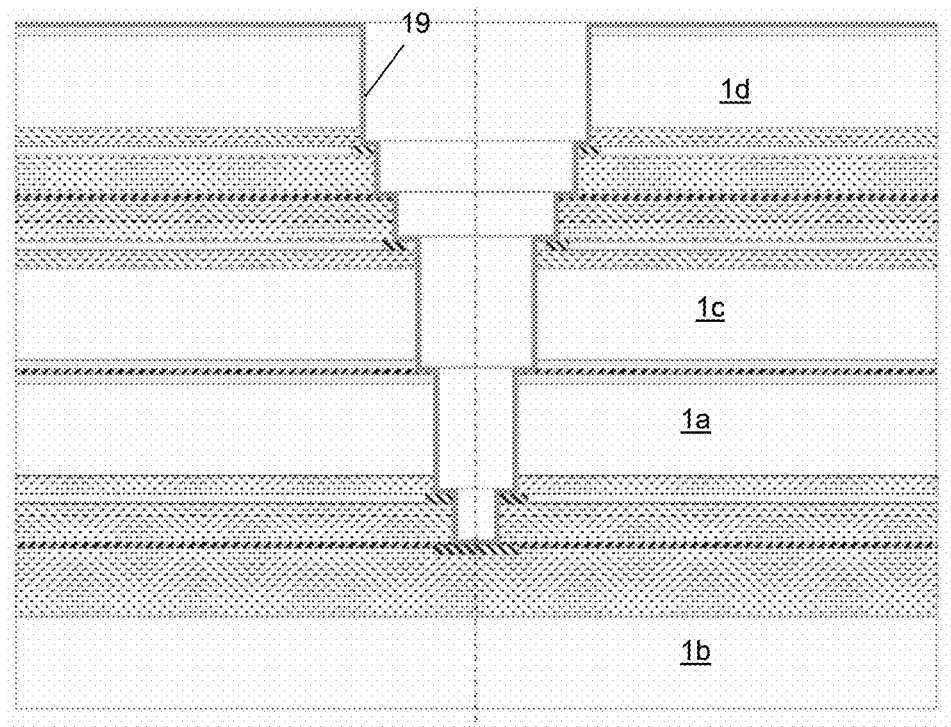
Figure 6J:
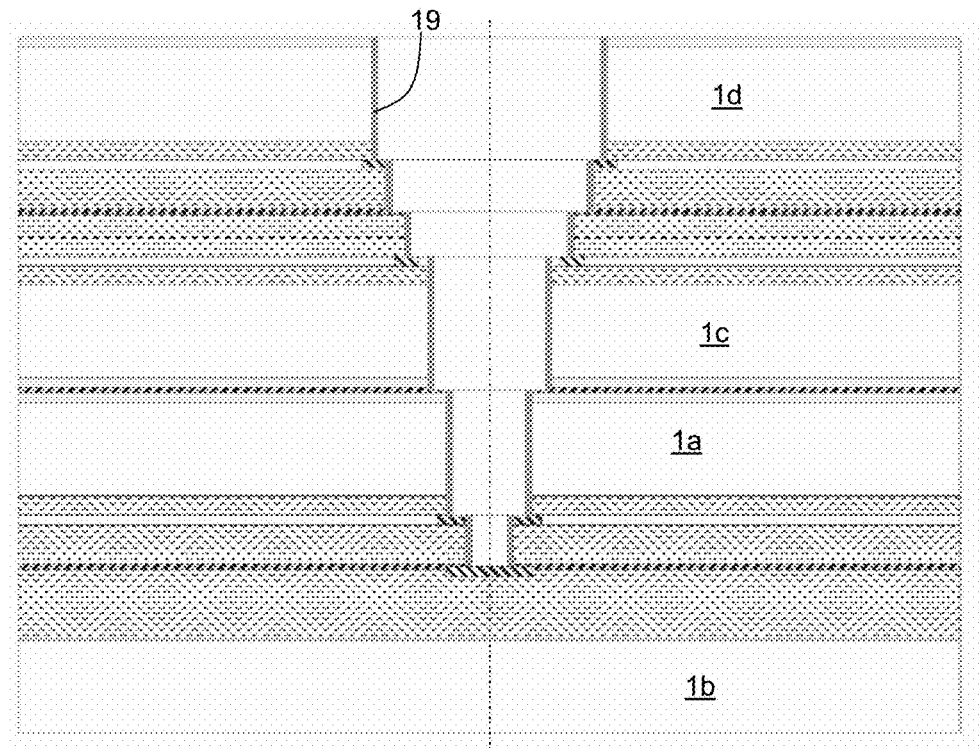
Figure 6K:
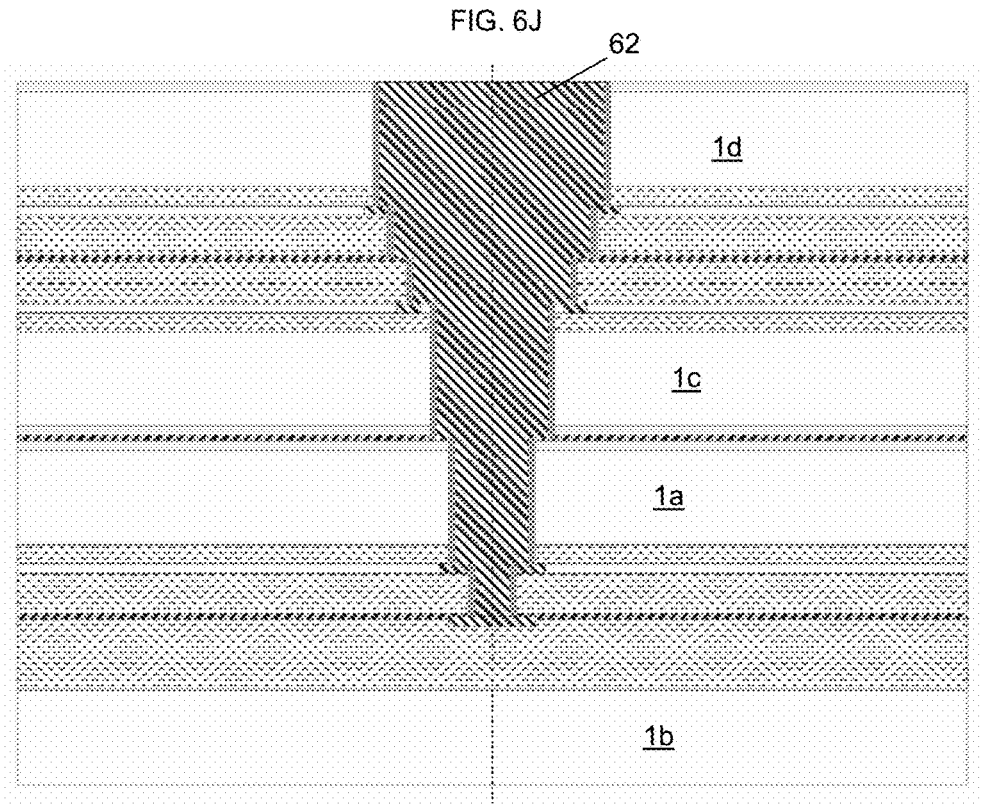

FIGS. 6A through 6K illustrate how the method of the present disclosure may be applied to interconnect more than two chips. FIG. 6A shows a first and second wafer 20a/20b, consisting of substrates 1a/1b carrying chips 10a/10b which are to be bonded. The chips on both wafers are similar to the ones shown in the embodiment of FIGS. 1A through 1H: the first chip 10a has a perforated metal contact pad 4a, and a dielectric bonding layer 5a. The second chip 10b has a full metal contact pad 4b and a metal pad 17 incorporated in the bonding layer 5b. The first chip 10a further has a cavity 16 through the bonding layer, through part of the FEOL/BEOL part, indicated by a single numeral 2a and through the perforation of the metal contact pad 4a. The wafers are aligned and bonded, after which the upper substrate 1a is thinned and a passivation layer 40 and a bonding layer 41 are deposited on the thinned surface, as shown in FIG. 6B. After that, a TSV opening 18 is made in the thinned surface, down to the cavity 16, as shown in FIG. 6C, thereby creating an aggregate opening 25. A third and fourth wafer 20c/20d consisting of substrates 1c/1d carrying a third and fourth chip 10c/10d are then provided, as shown in FIG. 6D, each of these chips having contact pads 4c/4d with central perforations. The inner diameter of the contact pad 4c in the third wafer is higher than the diameter of the TSV opening 18. The inner diameter of the contact pad 4d in the fourth chip 10d is higher than the inner diameter of the contact pad 4c in the third chip. Cavities 42/43 are produced in each of the third and fourth chip, respectively reaching down to the surface of the contact pad 4c and through the perforation of the contact pad 4d. The third and fourth wafer are aligned and bonded so as to form an aggregate cavity 44 and the top wafer is thinned and provided with a passivation and bonding layer 45/46, as shown in FIG. 6E. Then a further TSV opening 47 is produced through the thinned upper substrate 1c, as shown in FIG. 6F, and reaching down to the aggregate cavity 44, thereby forming a second aggregate opening consisting of the TSV opening 47 and the aggregate cavity 44. Finally the two wafer stacks are aligned and bonded, the upper substrate 1d is thinned and a passivation layer 50 is applied, as shown in FIG. 6G. Then a final TSV opening 51 is etched in the thinned upper substrate 1d, as shown in FIG. 6H, landing on the contact pad of the upper chip 10d, and creating an aggregate opening 52 in the 4-wafer stack. A liner 19 is deposited on the side walls, the bottom and all the horizontal parts of the aggregate opening 52, as shown in FIG. 6I. The liner is removed from the bottom and from the horizontal parts by a plasma etch as described above, as shown in FIG. 6J. Then the aggregate opening is filled with a metal plug 62, as shown in FIG. 6K, by the same method steps as described in previous embodiments. The metal plug 62 interconnects the four chips 10a to 10d. The formation of the cavities 16, 42, 43 and the aggregate opening 44+47 prior to the respective bonding steps yields the advantage of the present disclosure, i.e., the minimization of overetching of metal contact pads and of damage by copper sputtering. Instead of a stack of additional substrates 1c/1d, a single additional substrate 1c could be bonded to the previously produced assembly of substrates 1a/1b, after forming a cavity in the additional substrate and aligning the cavity to the aggregate opening 25 in the assembly 1a/1b.

The present disclosure is not limited to cavities and/or TSV openings having a circular cross-section. As stated above, the cross section of the TSV opening 18 is preferably larger than the cross section of the cavity 16. If this is not the case, the aggregate opening 25 may for example have a smaller cross-section at the top, and a larger cross section at the bottom. Also, it may be that the TSV opening 18 only partially overlaps the cavity 16. These conditions will make it more difficult to properly fill the aggregate opening with metal. Nevertheless, within limits it has been shown to be possible to fill such an opening so that a usable TSV plug is obtained.

FIGS. 7A through 7D illustrate an embodiment wherein the cross section of the contact pads and of the cavities is rectangular and wherein a multiwafer stack is produced by addition of subsequent wafers, each wafer being provided with a cavity in accordance with the present disclosure. Contact pads of subsequent substrates are arranged in stepwise fashion within a common TSV opening, allowing a single interconnect plug to interconnect a plurality of chips. In the exemplary case shown in FIGS. 7A through 7C, 4 chips are interconnected. In these figures, a top view of the contact pads and cavities is shown, as well as side views in two directions, to illustrate how the various levels may be interconnected. For the sake of simplifying the drawings, no distinction is made between IMD dielectric layers, bonding dielectric layers, or the dielectric applied in redistribution layers. All dielectrics are marked by the same hatching type. In reality, this distinction remains the same as in the previously described embodiments.

Figure 7A:
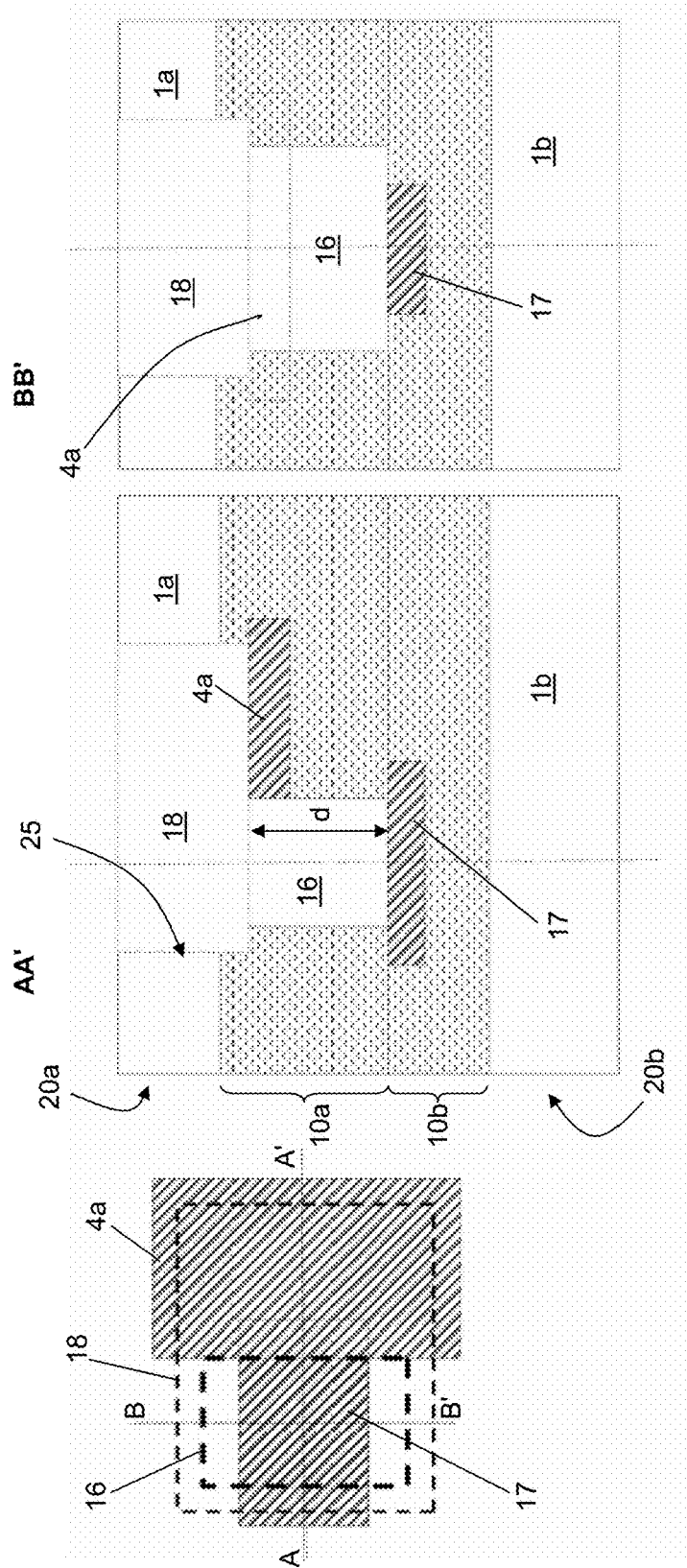
FIGS. 7A through 7C illustrate a multi-wafer embodiment with a different shape of the contact pads and cavities.

FIG. 7A shows the situation after bonding of the first two wafers 20a and 20b and formation of a first TSV opening 18. Wafer 20a includes semiconductor substrate 1a, carrying a first chip 10a and wafer 20b includes semiconductor substrate 1b carrying a second chip 10b. The second chip 10b includes a metal contact pad 17 embedded in a dielectric bonding layer. As in the previous embodiments, the metal pad 17 is in contact with a BEOL contact of the second chip (like contact 4b in previous embodiments), but such a BEOL contact is not shown in FIG. 7A. The metal contact pad 17 has a rectangular cross-section, as shown in the top view. The first chip 10a has a contact pad 4a that is also rectangular-shaped. Prior to bonding, a rectangular cavity 16 is made in the first chip, with a depth d and placed adjacent to the contact pad 4a. In the assembly of the two substrates, the cavity 16 overlaps the contact pad 17 of the second chip 10b. After bonding, a rectangular TSV opening 18 is formed in the second substrate 20b. The TSV opening 18 overlaps the cavity 16. The TSV opening's cross-section is larger than the cross-section of the cavity 16. Etching of the TSV opening 18 continues until an aggregate opening 25 is formed. In a two-wafer embodiment, the situation shown in FIG. 7A could be followed by the liner deposition as described above, removal of the liner from the horizontal surfaces, and formation of an interconnect plug that contacts the contact pads 4a and 17.

Figure 7B:
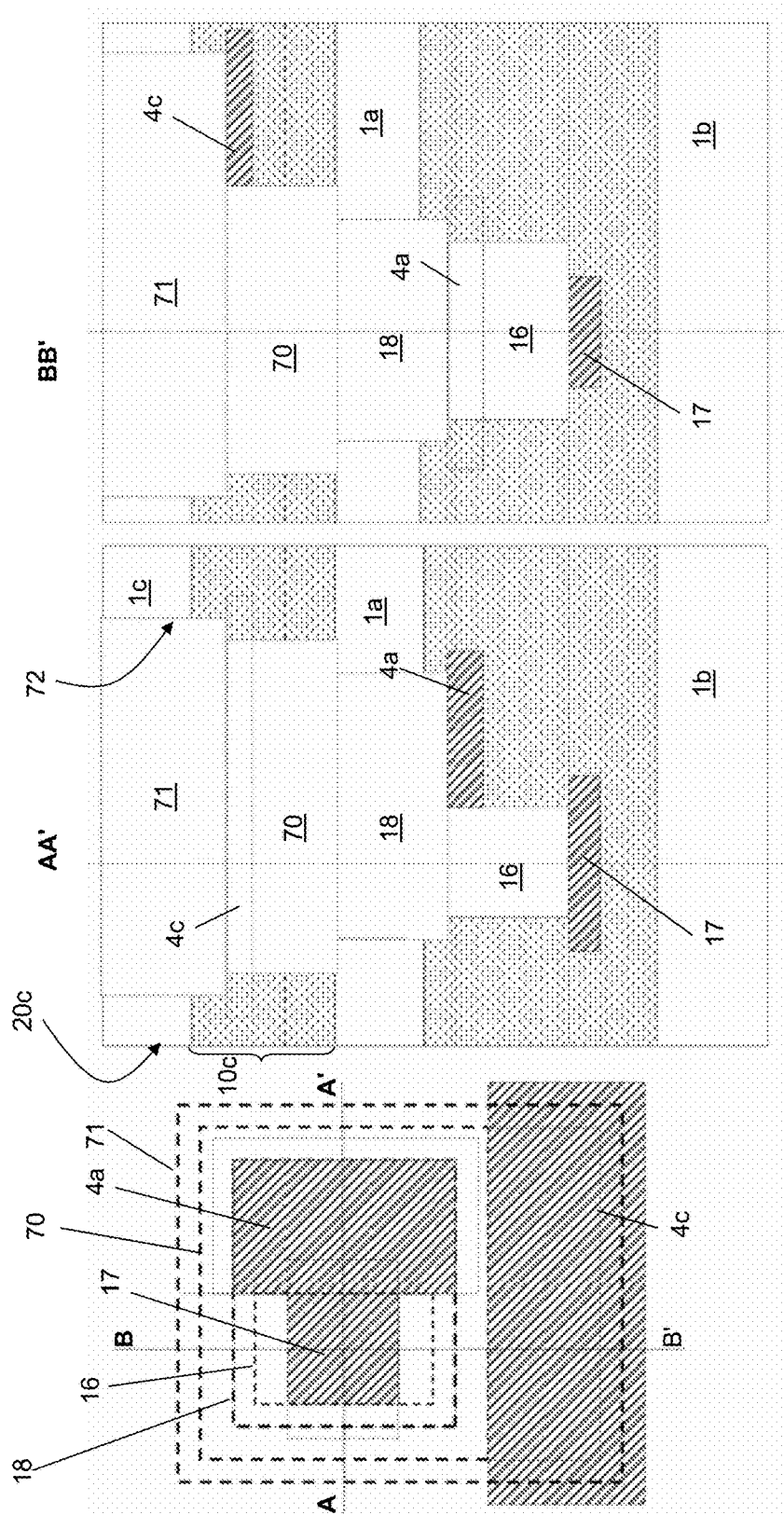

In the multi-wafer embodiment, illustrated further in FIG. 7B, a third wafer 20c is bonded to the stack of the first two wafers 20a/20b, after formation of the aggregate opening 25. The third wafer includes semiconductor substrate 1c, carrying a third chip 10c including a rectangular contact pad 4c, and a rectangular cavity 70 adjacent to the contact pad 4c. The cavity 70 is etched in the third wafer before bonding the third wafer 20c to the stack of the first and second wafers 20a/20b. The bonding step results in the assembly of the three wafers 20a/20b/20c. In the assembly, the second cavity 70 overlaps the contact pads 17 and 4a in the second and first chip respectively. A second TSV opening 71 is then etched, the cross-section of the second TSV opening overlapping the contact pad 4c of the third substrate as well as the first and second cavities 16 and 70. The etching continues until a new aggregate opening 72 is formed.

Figure 7C:
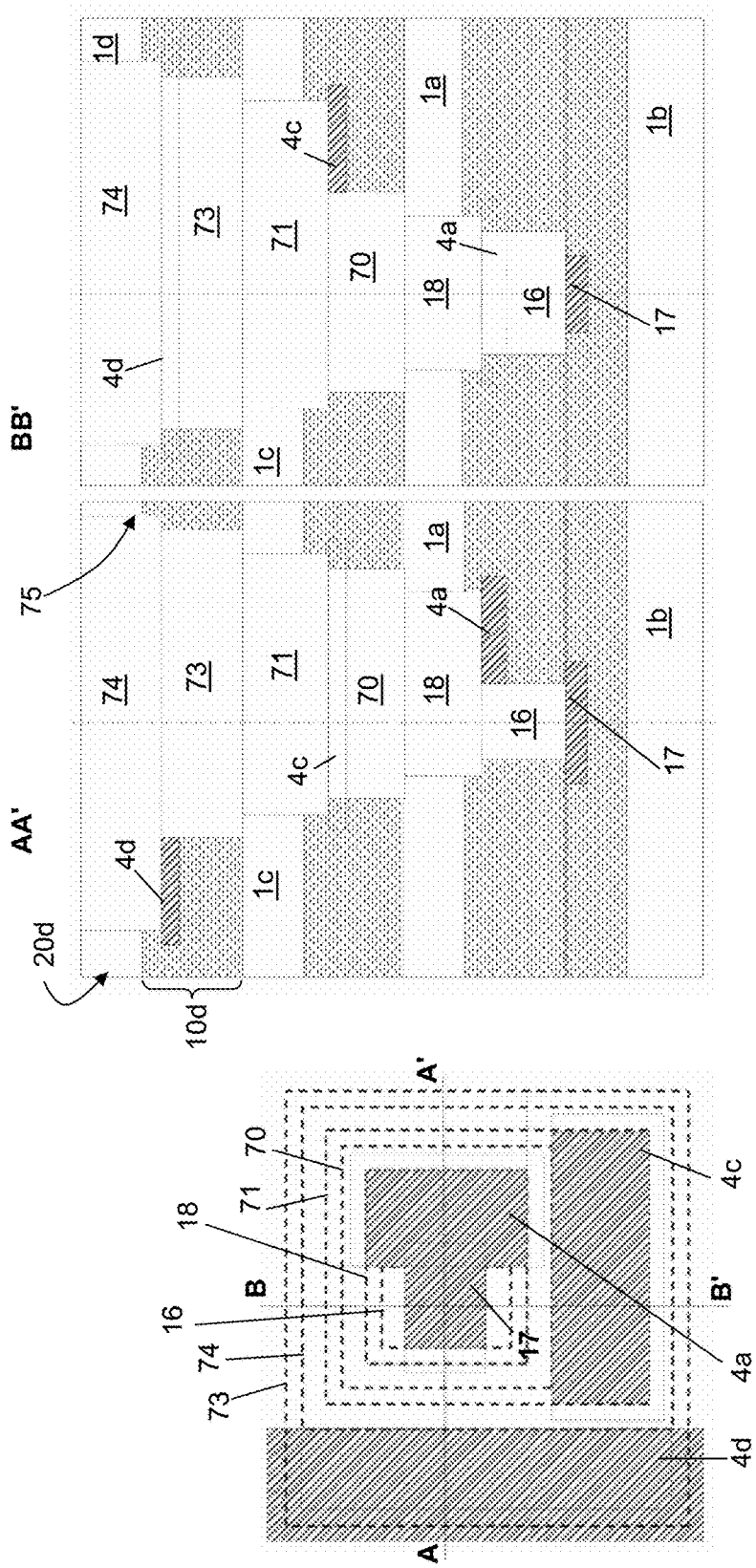

Finally, as shown in FIG. 7C, a fourth wafer 20d is added, comprising a fourth substrate 1d carrying a fourth chip 10d, having a further rectangular contact pad 4d and a third cavity 73 adjacent to the contact pad and etched in the fourth wafer before bonding this wafer to the assembly of the first to third wafers. A third TSV opening 74 is etched that overlaps the contact pad 4d of the fourth substrate as well as the first, second and third cavities 16, 70 and 73. The etching of the third TSV opening 74 continues until a final aggregate opening 75 is formed. These process steps are followed (not shown) by the deposition of a liner, removal of the liner from all horizontal surfaces, and deposition of an interconnection plug that interconnects the four levels.

In the above-described 4-wafer embodiment, as in any embodiment according to the present disclosure, the dimensions of the various contact pads, cavities, and TSV openings takes into account the wafer-to-wafer alignment tolerance, the back-to-face accuracy of the through-semiconductor via etching applied for producing the TSV openings, and the thickness of the dielectric liner that is to be produced on the sidewalls of the aggregate openings. According to one advantageous embodiment, these dimensions are chosen so that the contact area between the pads and the TSV plug is the same for all the levels in the stack.

Figure 8:
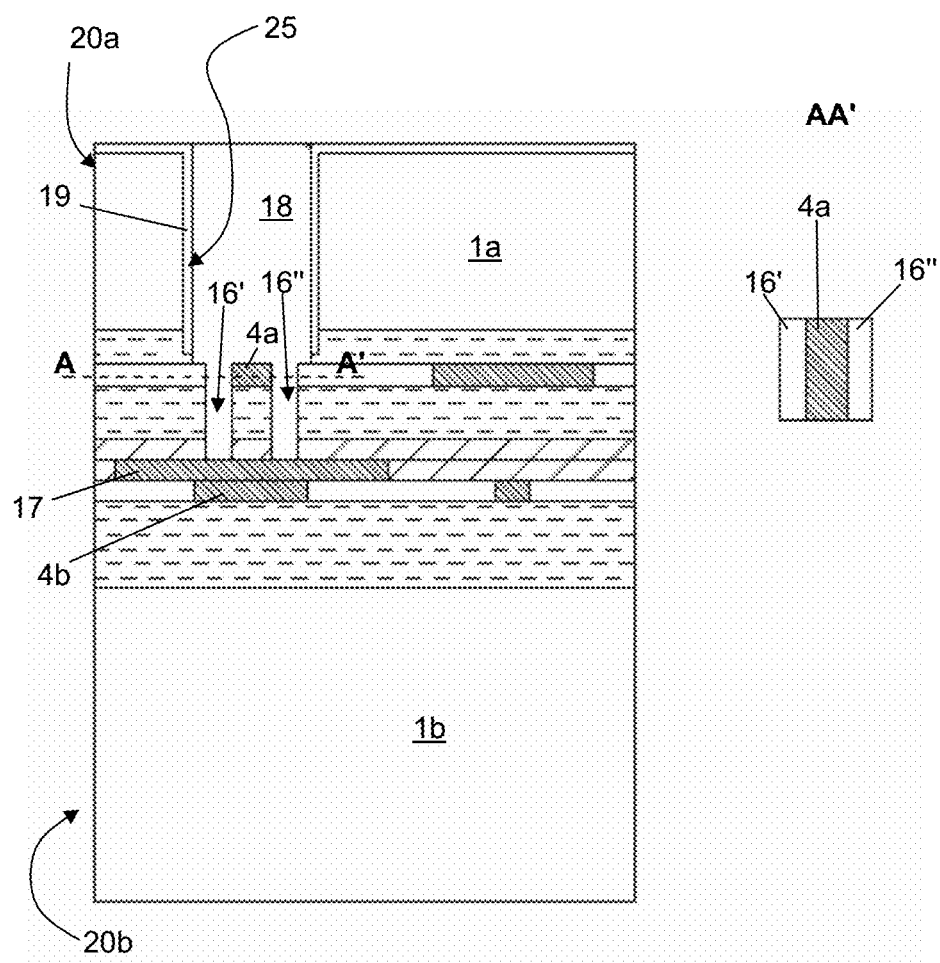
FIG. 8 illustrates an embodiment wherein multiple cavities are produced in the same wafer.

Other shapes of the cavities 16/70/73 are possible. Instead of a single cavity, multiple cavities can be produced in one chip. This is illustrated in FIG. 8. The second substrate 20b and the second chip 10b are the same as in the embodiment of FIGS. 1A through 1H. The contact pad 4a in the first chip 10a has a rectangular shape here, and two cavities 16' and 16" are etched on either side of the contact pad 4a, prior to bonding the first substrate 20a to the second substrate 20b. The cavities 16'/16" are located so that after bonding, they overlap with the contact pad 17 of the second chip 10b. The TSV opening 18 is etched in the same manner as in the embodiment of FIGS. 1A through 1H. The cross-section of the TSV opening 18 overlaps the cavities 16' and 16". Etching of the TSV opening 18 down to the cavities 16'/16", interrupting the etch and depositing the liner on the sidewalls of the TSV opening 18, finally leads to an aggregate opening 25 including the TSV opening and the parallel cavities. This aggregate opening may then be filled with metal as described with respect to the previous embodiments.

In each of the embodiments described above wherein a contact pad 4a of the first chip is connected by the plug 26 to a contact pad 17/4b of the second chip, it is seen that the cavity 16 is located in close proximity to the contact pad 4a of the first chip, and that the TSV opening 18 overlaps both the cavity 16 and the contact pad 4a of the first chip 10a. "In close proximity" as used herein means that the cavity is directly adjacent to the contact pad (as in the embodiment of FIGS. 7A through 7C), or sufficiently close to allow that a single TSV opening is capable of overlapping both the cavity 16 and the contact pad 4a. As seen also in the relevant embodiments, the bottom of the cavity is preferably in the same plane as the upper plane of the contact pad 4a of the first chip (as seen in the assemblies shown in the drawings). As the thicknesses of the contact pads are very small in reality, this is not a required condition, nor a condition that can be easily reproduced: in practice, the bottom of the cavity may deviate from this ideal situation. Preferably the bottom of the cavity 16 is as close as possible to the upper or lower plane of the contact structure 4a of the upper chip in the assembly. In other words, the bottom of the cavity is in close proximity to the contact structure 4a of the upper chip.

The present disclosure describes certain aspects and features as "preferably" implemented or "preferred," but it will be understood that these implementations of the present disclosure are examples and other implementations are possible. While the present disclosure has been illustrated and described in detail in the drawings and foregoing description, such illustration and description are to be considered illustrative or exemplary and not restrictive. Other variations to the disclosed embodiments can be understood and effected by those skilled in the art in practicing the present disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or produced "on" another layer or substrate, includes the options of the layer being present, produced, or deposited directly on, i.e., in physical contact with, the other layer or substrate, and the layer being present, produced, or deposited on one or a stack of intermediate layers between the layer and the other layer or substrate.

What is claimed is:

1. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein the first IC device comprises a stack of dielectric layers with the dielectric bonding layer being present on top of the stack of dielectric layers, wherein the cavity further traverses one or more of the stack of dielectric layers, wherein the first IC device comprises a front-end-of-line (FEOL) portion and a back-end-of-line (BEOL) portion, and wherein the stack of dielectric layers comprises a stack of intermetal dielectric layers in the BEOL portion, or in the BEOL portion as well as in the FEOL portion of the first IC device.

2. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein the cavity is in close proximity to the metal contact structure of the first IC device, wherein the TSV opening overlaps the metal contact structure of the first IC device, so that the interconnection plug interconnects the metal contact structure of the first IC device with the metal contact structure of the second IC device, wherein the first IC device comprises a front-end-of-line (FEOL) portion and a back-end-of-line (BEOL) portion, and wherein the metal contact structure of the first IC device is a metal contact pad that is part of the FEOL portion or the BEOL portion of the first IC device.

3. The method according to claim 2, wherein:

the metal contact structure of the first IC device is a metal contact pad with a centrally placed open area; and the cavity of the first IC device at least partially traverses the open area.

4. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein the cavity is in close proximity to the metal contact structure of the first IC device, wherein the TSV opening overlaps the metal contact structure of the first IC device, so that the interconnection plug interconnects the metal contact structure of the first IC device with the metal contact structure of the second IC device, wherein the metal contact structure of the first IC device is a metal contact pad with a polygon-shaped cross-section in the plane of the metal contact pad, and wherein a bottom of the cavity is in close proximity to the polygon-shaped metal contact pad.

5. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein the second IC device comprises a metal contact pad incorporated in the dielectric bonding layer of the second IC device so that the upper surface of the metal contact pad is essentially in the same plane as the upper surface of the dielectric bonding layer, the metal contact pad is in electrical contact with the metal contact structure of the second IC device, wherein, in the substrate assembly, the cavity overlaps the metal contact pad, wherein an additional dielectric bonding layer is present on the dielectric bonding layer into which the metal contact pad is incorporated, and wherein the formation of the aggregate opening includes a step of etching through the additional dielectric bonding layer in the area of the additional layer overlapping the cavity.

6. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein the second IC device is equally provided with a cavity in the outer surface of the device, the cavity traversing at least the dielectric bonding layer of the second IC device, wherein the cavity of the second IC device overlaps the metal contact structure of the second IC device, and wherein bonding is performed so that both the cavity of the first IC device and the cavity of the second IC device are overlapping in the substrate assembly so as to form an aggregate cavity after bonding.

7. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein:

the procedure applied for producing the TSV opening is stopped before reaching the cavity, leaving a layer of remaining dielectric material between the TSV opening and the cavity;

after producing the TSV opening, the isolation liner is deposited on the sidewalls and the bottom of the TSV opening, followed by the step of removing the isolation liner from the bottom of the TSV opening; and after removing the isolation liner from the bottom of the TSV opening, the layer of remaining material between the TSV opening and the cavity is equally removed when forming the aggregate opening.

8. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein:

the procedure applied for producing the TSV opening is continued until the cavity is reached, thereby forming the aggregate opening;

after producing the TSV opening, the isolation liner is deposited on the sidewalls, the bottom, and horizontal portions of the aggregate opening; and after depositing the isolation liner, the isolation liner is removed from the bottom and from the horizontal portions of the aggregate opening before producing the interconnection plug.

9. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising:

producing at least one cavity in the outer surface of the first IC device, the cavity traversing at least the dielectric bonding layer of the first IC device;

aligning the first substrate with respect to the second substrate, and forming a substrate assembly by direct bonding between the dielectric bonding layers, so that in the substrate assembly the cavity formed in the first IC device overlaps a metal contact structure of the second IC device;

after bonding, optionally thinning the first substrate;

producing a Through Substrate Via (TSV) opening in the first substrate, the TSV opening overlapping the cavity;

forming an aggregate opening comprising the TSV opening and the cavity, thereby exposing at least part of the metal contact structure of the second IC device;

after the formation of an isolation liner on at least part of the sidewalls of the aggregate opening, producing a metal interconnection plug in the aggregate opening, that contacts the metal contact structure of the second IC device, and forms at least part of an interconnection path between the metal contact structure of the second IC device and a metal contact structure of the first IC device, wherein:

after the formation of the TSV opening, an additional substrate or a stack of additional substrates is bonded to the substrate assembly, each additional substrate carrying an additional IC device;

the additional substrate or the stack of additional substrates is provided with a second cavity in its bonding surface, before bonding the additional substrate or stack of substrates to the assembly, so that the bonding step results in a new assembly wherein the second opening overlaps the TSV opening to form a second cavity;

a second TSV opening is produced in the new assembly, the additional TSV opening overlapping the second cavity, thereby forming a new aggregate opening comprising the cavity in the first IC device, the TSV opening, the second cavity, and the second TSV opening;

optionally the previous steps are repeated one or more times, each time adding a further substrate or stack of substrates to the assembly, and leading to a final assembly comprising a final aggregate opening;

after the formation of an isolation liner on at least part of the sidewalls of the final aggregate opening, a metal interconnection plug is produced in the final aggregate opening, that contacts the metal contact structure of the second IC device.

10. The method according to claim 9, wherein a stack of two additional substrates is bonded to the substrate assembly, and wherein the stack is obtained by bonding a first additional substrate to a second additional substrate so that both the cavity of the first additional substrate and the cavity of the second additional substrate are overlapping in the substrate assembly so as to obtain a stack comprising an aggregate cavity, and wherein an additional TSV opening is produced in the bonding surface of the stack, to thereby obtain a stack with the second cavity in its outer surface, the second cavity formed by the aggregate cavity and the additional TSV opening.

11. The method according to claim 9, wherein each of the IC devices in the final assembly comprises a metal contact structure that is contacted by the interconnection plug formed in the final aggregate opening.

* * * * *